(12) United States Patent
Nakajiki et al.

(10) Patent No.: US 9,263,493 B2
(45) Date of Patent: Feb. 16, 2016

(54) IMAGE PICKUP ELEMENT, IMAGING APPARATUS, MANUFACTURING APPARATUS FOR IMAGE PICKUP ELEMENT, AND MANUFACTURING METHOD FOR IMAGE PICKUP ELEMENT

(71) Applicant: Sony Corporation, Tokyo (JP)

(72) Inventors: Sintaro Nakajiki, Kumamoto (JP); Yukihiro Sayama, Kumamoto (JP); Yoshinori Toumiya, Kumamoto (JP); Tadayuki Dofuku, Kumamoto (JP); Toyomi Jinwaki, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/340,350

(22) Filed: Jul. 24, 2014

(65) Prior Publication Data
US 2015/0035105 A1 Feb. 5, 2015

(30) Foreign Application Priority Data
Jul. 31, 2013 (JP) .................................. 2013-158558

(51) Int. Cl.
*H01L 27/146* (2006.01)

(52) U.S. Cl.
CPC .... *H01L 27/14643* (2013.01); *H01L 27/14623* (2013.01); *H01L 27/14627* (2013.01); *H01L 27/14685* (2013.01); *H01L 27/14689* (2013.01)

(58) Field of Classification Search
CPC ................................... H01L 27/146–27/14893
See application file for complete search history.

(56) References Cited

U.S. PATENT DOCUMENTS

| | | | | |
|---|---|---|---|---|
| 2003/0122209 A1* | 7/2003 | Uya | ............................... | 257/435 |
| 2009/0128912 A1* | 5/2009 | Okada et al. | ................... | 359/576 |
| 2013/0134540 A1* | 5/2013 | Maeda et al. | ................. | 257/432 |

* cited by examiner

*Primary Examiner* — Daniel Shook
(74) *Attorney, Agent, or Firm* — Sheridan Ross P.C.

(57) ABSTRACT

Provided is an image pickup element, including: condenser lenses made of a resin containing fine metal particles; photoelectric conversion elements formed in a silicon substrate and each configured to photoelectrically convert incident light that enter from an outside through corresponding one of the condenser lenses; and a protective film made of a silicon compound, the protective film being formed between the condenser lenses and the silicon substrate.

16 Claims, 14 Drawing Sheets

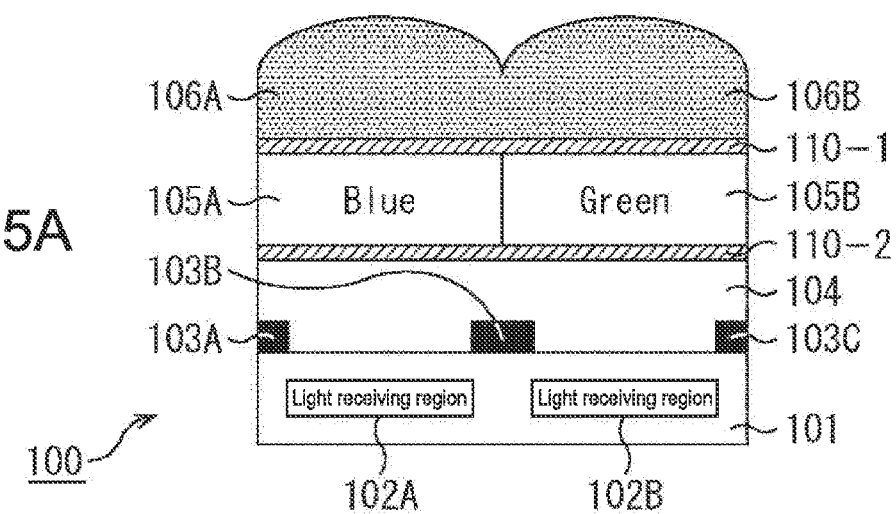
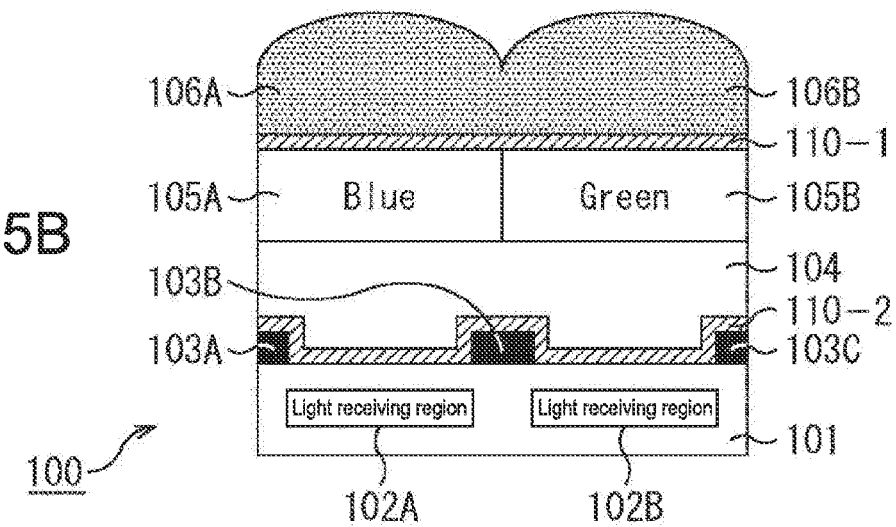
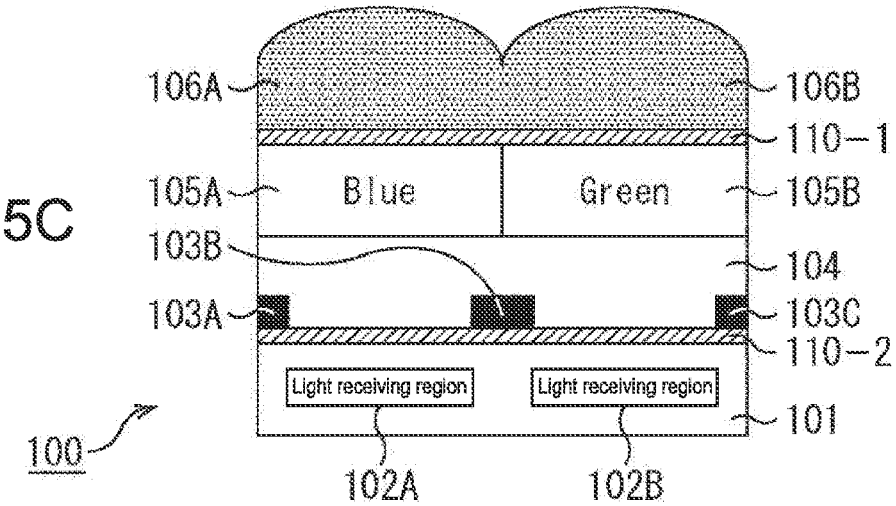

IMAGE PICKUP ELEMENT, IMAGING APPARATUS, MANUFACTURING APPARATUS FOR IMAGE PICKUP ELEMENT, AND MANUFACTURING METHOD FOR IMAGE PICKUP ELEMENT

CROSS REFERENCE TO RELATED APPLICATIONS

This application claims the benefit of Japanese Priority Patent Application JP 2013-158558 filed Jul. 31, 2013, the entire contents of which are incorporated herein by reference.

BACKGROUND

The present disclosure relates to an image pickup element, an imaging apparatus, a manufacturing apparatus for the image pickup element, and a manufacturing method for the image pickup element. More specifically, the present disclosure relates to an image pickup element, an imaging apparatus, a manufacturing apparatus for the image pickup element, and a manufacturing method for the image pickup element that enable suppression of deterioration in quality of captured images.

In relate art, in order to enhance sensitivity and shading characteristics of a solid-state image pickup element, there have been developed a method of reducing a distance between a condenser lens (microlens) and a photodiode (PD) that are provided in each pixel (i.e., a method of reducing height of solid-state image pickup element). In order to suppress deterioration in light collection efficiency, which may be caused by such height reduction, the possibility of increasing a refractive index of the microlens has been investigated.

Specifically, the possibility of forming the microlens with use of a silicon nitride (SiN) inorganic film having a high refractive index has been investigated. However, in that case, the microlens is difficult to form with high accuracy without a planarizing film configured to planarize surfaces of color filters (refer to, for example, Japanese Patent Application Laid-open No. 2008-277800). In addition, this planarizing film needs to have a film thickness of from approximately 200 nm to 300 nm so as to planarize the surfaces of the color filters. Therefore, height reduction of the solid-state image pickup element has been difficult to achieve.

In view of the circumstance, the possibility of forming the microlens with use of a resin system containing fine metal particles (refer to, for example, Japanese Patent Application Laid-open No. 2008-060464). In the case of using the resin system containing fine metal particles, the microlenses can be formed by spin coating, and hence is not liable to be influenced by steps on the surfaces of the color filters. Thus, the microlens can be formed with high accuracy without the planarizing film. As a result, height reduction of the solid-state image pickup element can be achieved.

SUMMARY

However, in the microlens formed with use of the resin containing fine metal particles, heat treatment after formation of the microlens may cause species of ions contained in the high refractive index resin to move into the photodiode (PD). As a result, dark current may be generated, and white spot deterioration may occur. In other words, quality of images captured via the solid-state image pickup element may be deteriorated.

There is a need to suppress deterioration in quality of captured images.

According to an embodiment of the present disclosure, there is provided an image pickup element, including: condenser lenses made of a resin containing fine metal particles; photoelectric conversion elements formed in a silicon substrate and each configured to photoelectrically convert incident light that enter from an outside through corresponding one of the condenser lenses; and a protective film made of a silicon compound, the protective film being formed between the condenser lenses and the silicon substrate.

The protective film may have a non-flat surface at least on the condenser lens side.

The silicon compound may include any one of silicon dioxide ($SiO_2$), silicon oxynitride (SiON), and silicon nitride (SiN).

The protective film may have a film thickness of 20 nm or more.

The image pickup element may further include optical filters each formed between corresponding one of the condenser lenses and the silicon substrate and each configured to limit a wavelength band of the incident light to be transmitted therethrough. The protective film may be formed between the condenser lenses and the optical filters.

The optical filters may at least include a color filter containing a dioxane pigment.

The color filter containing the dioxane pigment may include a blue color filter.

The image pickup element may further include a planarizing film formed between the optical filters and the silicon substrate. The protective film may include another protective film formed between the optical filters and the planarizing film.

The protective film may include still another protective film formed between the planarizing film and the silicon substrate.

The image pickup element may further include light blocking films formed along pixel edge portions between the planarizing film and the silicon substrate and configured to suppress the incident light from entering adjacent pixels. The still another protective film formed between the planarizing film and the silicon substrate may be formed between the planarizing film and a laminate of the light blocking films and the silicon substrate.

The image pickup element may further include a planarizing film formed between the optical filters and the silicon substrate. The protective film may include another protective film formed between the planarizing film and the silicon substrate.

The image pickup element may further include light blocking films formed along pixel edge portions between the planarizing film and the silicon substrate and configured to suppress the incident light from entering adjacent pixels. The other protective film formed between the planarizing film and the silicon substrate may be formed between the planarizing film and a laminate of the light blocking films and the silicon substrate.

The image pickup element may further include: optical filters each formed between corresponding one of the condenser lenses and the silicon substrate and each configured to limit a wavelength band of the incident light to be transmitted therethrough; and a planarizing film formed between the condenser lenses and the silicon substrate. The protective film may be formed to extend between one of the optical filters and corresponding one of the condenser lenses, between the one of the optical filters and another of the optical filters, and between the other of the optical filters and the planarizing film.

The protective film may include another protective film formed between the planarizing film and the silicon substrate.

The image pickup element may further include: optical filters each formed between corresponding one of the condenser lenses and the silicon substrate and each configured to limit a wavelength band of the incident light to be transmitted therethrough; and a planarizing film formed between the condenser lenses and the silicon substrate. The protective film may be formed between the optical filters and the planarizing film.

The protective film may include another protective film formed between the planarizing film and the silicon substrate.

The image pickup element may further include: optical filters each formed between corresponding one of the condenser lenses and the silicon substrate and each configured to limit a wavelength band of the incident light to be transmitted therethrough; and a planarizing film formed between the condenser lenses and the silicon substrate. The protective film may be formed between the planarizing film and the silicon substrate.

According to another embodiment of the present disclosure, there is provided an imaging apparatus, including: an image pickup element including condenser lenses made of a resin containing fine metal particles, photoelectric conversion elements formed in a silicon substrate and each configured to photoelectrically convert incident light that enter from an outside through corresponding one of the condenser lenses, and a protective film made of a silicon compound, the protective film being formed between the condenser lenses and the silicon substrate; and an image processing unit configured to execute image processes on data items of images captured via the image pickup element.

According to still another embodiment of the present disclosure, there is provided a manufacturing apparatus configured to manufacture an image pickup element, the manufacturing apparatus including: a photoelectric-conversion-element forming unit configured to form, in a silicon substrate, photoelectric conversion elements configured to photoelectrically convert incident light; a protective film forming unit configured to form a protective film made of a silicon compound on an incident side of the silicon substrate in which the photoelectric conversion elements are formed by the photoelectric-conversion-element forming unit, the incident light entering the incident side of the silicon substrate; and a condenser lens forming unit configured to form condenser lenses each made of a resin containing fine metal particles on a side opposite to the silicon substrate side of the protective film formed by the protective film forming unit, the condenser lens being configured to condense the incident light.

According to yet another embodiment of the present disclosure, there is provided a manufacturing method for a manufacturing apparatus configured to manufacture an image pickup element, the manufacturing method including: forming, in a silicon substrate, photoelectric conversion elements configured to photoelectrically convert incident light; forming a protective film made of a silicon compound on an incident side of the silicon substrate in which the photoelectric conversion elements are formed, the incident light entering the incident side of the silicon substrate; and forming condenser lenses each made of a resin containing fine metal particles on a side opposite to the silicon substrate side of the protective film, the condenser lens being configured to condense the incident light.

The image pickup element according to the embodiment of the present disclosure includes: condenser lenses made of a resin containing fine metal particles; photoelectric conversion elements formed in a silicon substrate and each configured to photoelectrically convert incident light that enter from an outside through corresponding one of the condenser lenses; and a protective film made of a silicon compound, the protective film being formed between the condenser lenses and the silicon substrate.

The imaging apparatus according to the other embodiment of the present disclosure includes: an image pickup element including condenser lenses made of a resin containing fine metal particles, photoelectric conversion elements formed in a silicon substrate and each configured to photoelectrically convert incident light that enter from an outside through corresponding one of the condenser lenses, and a protective film made of a silicon compound, the protective film being formed between the condenser lenses and the silicon substrate; and an image processing unit configured to execute image processes on data items of images captured via the image pickup element.

The manufacturing apparatus according to the still another embodiment of the present disclosure is configured to manufacture an image pickup element. In the manufacturing apparatus, photoelectric conversion elements configured to photoelectrically convert incident light are formed in a silicon substrate, a protective film made of a silicon compound is formed on an incident side of the silicon substrate in which the photoelectric conversion elements are formed, the incident light entering the incident side of the silicon substrate, and condenser lenses each made of a resin containing fine metal particles are formed on a side opposite to the silicon substrate side of the protective film, the condenser lens being configured to condense the incident light.

According to the embodiments of the present disclosure, photographic subjects can be imaged, and in particular, quality of captured images can be suppressed from being deteriorated.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 5A-5C are sectional views illustrating main configuration examples of the image pickup element;

DETAILED DESCRIPTION OF EMBODIMENTS

Figure 1:
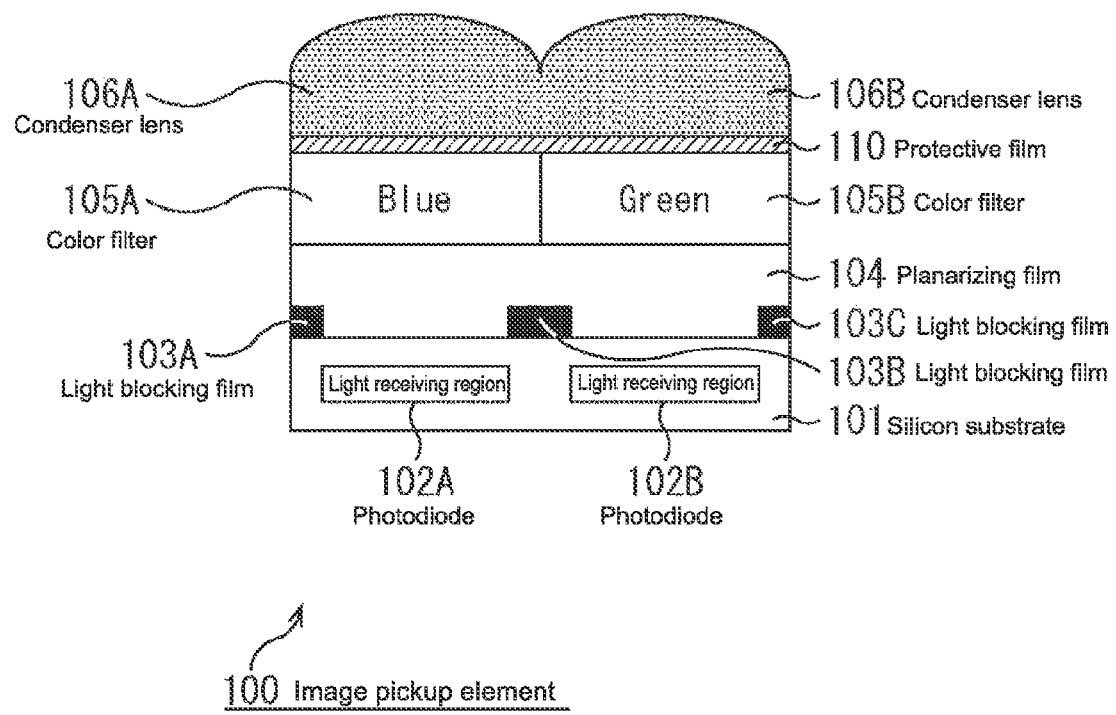
FIG. 1 is a sectional view illustrating a configuration example of a part of an image pickup element.

Hereinafter, embodiments for carrying out the present disclosure (hereinafter, abbreviated as embodiments) will be described with reference to the drawings. Note that, the description is made in the following order.

1. First embodiment (Image pickup element)
2. Second embodiment (Manufacturing apparatus)
3. Third embodiment (Imaging apparatus)

1. First Embodiment

Height Reduction of Image Pickup Element and Influence Thereof

In relate art, in order to enhance sensitivity and shading characteristics of a solid-state image pickup element, there have been developed a method of reducing a distance between a condenser lens (microlens) and a photodiode (PD) that are provided in each pixel (i.e., a method of reducing height of solid-state image pickup element). Such height reduction may cause deterioration in light collection efficiency. In order to suppress such deterioration in light collection efficiency, the microlens should be reduced in radius of curvature or increased in refractive index.

The microlens is difficult to form to be rounder than a hemispherical shape. In other words, there is a limitation on the reduction in radius of curvature of the microlens. Further, in recent years, the pixels of the solid-state image pickup element have been further miniaturized, and hence the microlens has become more difficult to reduce in radius of curvature. In general, the microlens is made, for example, of a polystyrene resin and an acrylic resin, and those resins each have a refractive index n of from approximately 1.5 to 1.6. Thus, for example, when the solid-state image pickup element has a pixel unit size of approximately 1 μm, the radius of curvature of the microlens of each of the pixels may be larger than that of a hemisphere, which may cause difficulty in manufacture.

In view of the circumstances, the possibility of increasing the refractive index of the microlens has been investigated. Specifically, with use of a silicon nitride (SiN) inorganic film, a microlens having a high refractive index (for example, n=1.6 or more) can be formed.

Meanwhile, color filters (R, G, and B) used in the solid-state image pickup element generally have steps on their surfaces. When, for example, microlenses made of silicon nitride (SiN) are formed on the color filters having such steps, irregularities of the surfaces of the microlenses may be formed by influence of the steps of the color filters, which may cause difficulty in forming microlenses with high accuracy. As a countermeasure, in order to suppress the irregularities, as disclosed, for example, in Japanese Patent Application Laid-open No. 2008-277800, there has been devised formation of a planarizing film configured to planarize the surfaces of the color filters. When such a planarizing film is formed and the microlenses are formed thereon, the influence of the steps of the color filters is suppressed. As a result, the microlenses can be formed with higher accuracy.

However, in order to planarize the surfaces of the microlenses, the planarizing film needs to have a film thickness of from approximately 200 nm to 300 nm. Thus, the distance from the microlens to the photodiode (PD) increases (height reduction of the solid-state image pickup element is difficult), which causes difficulty in suppressing deterioration of the sensitivity and the shading characteristics. In other words, when the microlens is formed of a silicon nitride (SiN) inorganic film, the sensitivity and the shading characteristics may be deteriorated.

Further, as a method of increasing the refractive index of the microlenses, as disclosed, for example, in Japanese Patent Application Laid-open No. 2008-060464, there has been devised a method of forming the microlenses with use of a resin system containing fine metal particles. In a case of using the resin system containing fine metal particles, the microlenses can be formed by spin coating without being influenced by the steps on the surfaces of the color filters. Thus, the planarizing film configured to planarize the surfaces of the color filters can be omitted. As a result, the distance from the microlens to the photodiode (PD) can be reduced (height reduction of the solid-state image pickup element can be achieved), and the microlenses can be formed with high accuracy.

However, in the microlens formed of the resin containing fine metal particles, heat treatment after formation of the microlens may cause ions of species such as hydrogen (H) and fluorine (F) contained in the high refractive index resin to move into the photodiode (PD). As a result, dark current may be generated, and white spot deterioration may occur. Further, the ions of such species may be moved also into the color filters, which may cause spectral changes of the color filters. As a result, quality of images captured via the solid-state image pickup element may be deteriorated.

(Image Pickup Element)

As a countermeasure, in the image pickup element, a protective film made of a silicon compound is formed between the microlenses (condenser lenses) and a silicon substrate in which the photodiodes (photoelectric conversion elements) are formed.

FIG. 1 is a sectional view illustrating a main configuration example of pixels of an image pickup element to which the present technology is applied. The image pickup element 100 illustrated in FIG. 1 is a backside illumination type CMOS (Complementary Metal Oxide Semiconductor) image sensor configured to image a photographic subject and acquire captured images as electrical signals. The image pickup element 100 includes a plurality of pixels arranged, for example, in an array or a plane. In each of the pixels, incident light is photoelectrically converted to a pixel signal of a captured image. FIG. 1 illustrates an example of a layered structure of a light receiving part of the image pickup element 100 in cross-section. For the sake of convenience of description, the layered structure of FIG. 1 is schematically illustrated. Further, in FIG. 1, for the sake of convenience of description, components (circuits, lines, or the like) configured to transmit charge obtained by the photoelectric conversion are omitted.

The light from the photographic subject enters the image pickup element 100 from top to bottom in FIG. 1. FIG. 1 illustrates a configuration of two pixels, but the number of the pixels of the image pickup element 100 is not particularly limited. In general, three or more pixels, specifically, several hundreds of thousands of pixels, several millions of pixels, and several tens of millions of pixels are provided. Those numbers of pixels each basically have the same configuration as the configuration of the pixels illustrated in FIG. 1.

As illustrated in FIG. 1, the image pickup element 100 includes a silicon substrate 101. The silicon substrate 101 includes a photodiode (PD) 102A formed as a light receiving region (photoelectric conversion element configured to photoelectrically convert incident light) of the left pixel of FIG. 1, and a photodiode (PD) 102B formed as a light receiving region (photoelectric conversion element) of the right pixel of FIG. 1. In the following, unless it is necessary to make distinctions between the photodiodes of those pixels, the photodiodes are referred to as photodiodes 102. In other words, the photodiodes 102 formed in the silicon substrate 101 correspond respectively to the pixels.

Further, as illustrated in FIG. 1, light blocking films 103A to 103C are formed on a light incident surface (upper side in FIG. 1) of the silicon substrate 101. The light blocking films are formed along pixel edge portions so as to partition the pixels. In other words, the light blocking films 103A to 103C illustrated in the sectional view of FIG. 1 are formed independently of each other between the pixels. However, actually, in accordance with arrangement of the pixels, light blocking films for all the pixels (or the light blocking films for some of the pixels) may be formed integrally with each other, for example, into a mesh-like pattern. In the following, unless it is necessary to make distinctions between the light blocking films for the pixels, the light blocking films 103A to 103C are referred to as light blocking films 103.

The light blocking films 103 are each made of a material having excellent light blocking properties, and configured to suppress incident light from entering adjacent pixels.

As illustrated in FIG. 1, the light blocking films 103 are formed on the light incident surface of the silicon substrate 101. With this, irregularities are formed on this surface on the light incident side. As a countermeasure, in order to suppress the irregularities so as to planarize the surface, a planarizing film 104 is laminated on surfaces on the light incident side (upper side in FIG. 1) of the silicon substrate 101 and the light blocking films 103. The planarizing film 104 is made of a material having a high transmittance.

Further, optical filters each configured to limit a wavelength band of the incident light to be transmitted therethrough are formed on a surface on the light incident side (upper side in FIG. 1) of the planarizing film 104. In the example of FIG. 1, a blue color filter 105A is formed in the left pixel of FIG. 1, and a green color filter 105B is formed in the right pixel of FIG. 1. Note that, in FIG. 1, the letters ("Blue" and "Green") on the color filter 105A and the color filter 105B are added for the sake of convenience of description, and are not actually printed thereon.

The color filter 105A is a color filter configured to transmit light in what is called a blue wavelength band (blue light). In other words, in the photodiode 102A, the blue light that transmits through the color filter 105A is photoelectrically converted. In still other words, the left pixel of FIG. 1 is a pixel configured to detect the blue light.

The color filter 105B is a color filter configured to transmit light in what is called a green wavelength band (green light). In other words, in the photodiode 102B, the green light that transmits through the color filter 105B is photoelectrically converted. In still other words, the right pixel of FIG. 1 is a pixel configured to detect the green light.

In the following, unless it is necessary to make distinctions between the color filters of the pixels, the color filters 105A and 105B are referred to as color filters 105. As illustrated in FIG. 1, the color filters 105 formed respectively in the pixels of the image pickup element 100 are each configured to transmit light in any wavelength band (in other words, light of any color), and the colors of the color filters 105 may be arbitrarily selected. For example, color filters 105 of yellow, white, and other colors may be formed. Further, the colors of the color filters 105 may be arbitrarily employed in any other combinations. In general, color filters 105 of three colors of red (R), green (G), and blue (B) are used in many cases, but four or more colors, or two or less colors may be employed.

Thus, although FIG. 1 illustrates only the blue pixel and the green pixel, pixels of other colors may be provided depending on the combinations of the colors of the color filters 105. For example, in a case where the color filters 105 of three colors of red (R), green (G), and blue (B) are used, the image pickup element 100 includes a red pixel provided with a red color filter (not shown) in addition to the pixels illustrated in FIG. 1. As a matter of course, the pixels of the respective colors each need not necessarily include one pixel of the corresponding color, and the pixels of the respective colors each generally include a plurality of pixels of the corresponding color.

Further, instead of the color filters 105, there may be formed optical filters configured to transmit or suppress light in a wavelength band other than that of visible light. For example, there may be formed filters configured to transmit ultraviolet light and infrared light, or there may be formed filters configured to block the ultraviolet light and the infrared light in contrast.

On a light incident surface side (upper side in FIG. 1) of the color filters 105, the condenser lenses (also referred to as microlenses) configured to increase light collection efficiency and to increase intensity of input light are provided respectively to the pixels. For example, a condenser lens 106A is formed in the left pixel of FIG. 1, and a condenser lens 106B is formed in the right pixel of FIG. 1. In the following, unless it is necessary to make distinctions between the condenser lenses of those pixels, the condenser lenses 106A and 106B are referred to as condenser lenses 106.

In other words, the light from the photographic subject is condensed by the condenser lenses 106 and enters the pixels. This incident light is transmitted through the color filters 105, the planarizing film 104, and the like, and photoelectrically converted by the photodiodes 102.

As described above, in order to increase the light collection efficiency, the condenser lenses 106 are made of the resin containing fine metal particles. The resin containing fine metal particles is a material having a refractive index higher than those of the polystyrene resin and the acrylic resin. Specifically, the refractive index at a wavelength of 500 nm falls within a range of from 1.6 to 2.0. Further, the transmittance of the resin containing fine metal particles is desirably as high as possible in a wavelength band of from 400 nm to 700 nm. For example, the transmittance is set to 90% or more.

The resin containing fine metal particles is obtained, for example, by adding particles of a metal compound to a copolymer resin and dispersing the added particles in the copolymer resin. Examples of the copolymer resin include an acrylic resin, a styrene resin, and a silane resin. Examples of the metal compound include titanium (Ti), magnesium (Mg), aluminum (Al), and zinc (Zn).

Actually, the color filters 105 are formed to have respective colors, and hence irregularities (steps in pixel units) are formed between the light incident surfaces (upper side in FIG. 1) thereof. In this way, the light incident surfaces are non-flat. However, as described above, the resin containing fine metal particles can be applied by spin coating, and hence is not liable to be influenced by the steps on the surfaces of the color filters 105. Thus, even without the planarizing film configured to planarize the light incident surfaces of the color filters 105, the microlenses can be formed with high accuracy. As a result, height reduction of the image pickup element 100 can be achieved.

In addition, as illustrated in FIG. 1, between the condenser lenses 106 and the color filters 105 of the image pickup element 100, there is formed a protective film 110 configured to suppress the species of ions from moving from the condenser lenses 106.

The protective film 110 is made of a silicon compound such as silicon dioxide ($SiO_2$), silicon oxynitride (SiON), and silicon nitride (SiN). A surface on the light incident side (upper side in FIG. 1) of the protective film 110 needs not be planarized, and hence there is no particular problem as long as a film thickness of approximately 20 nm or more is secured. In other words, the surface on the light incident side of the protective film 110 may be non-flat. In contrast, in order to planarize the surfaces of the color filters 105, as described above, the planarizing film needs to have a film thickness of at least from approximately 200 nm to 300 nm. In other words, the protective film 110 can be formed to be much thinner than the planarizing film.

The protective film 110 is capable of suppressing the species of ions from moving from the condenser lenses 106. Thus, influence of those species of ions on quality of images, such as spectral changes of the color filters 105, and generation of dark current and white spots can be suppressed. As a result, quality of images captured via the image pickup element 100 can be suppressed from being deteriorated.

(Spectral Change)

Figure 2A:
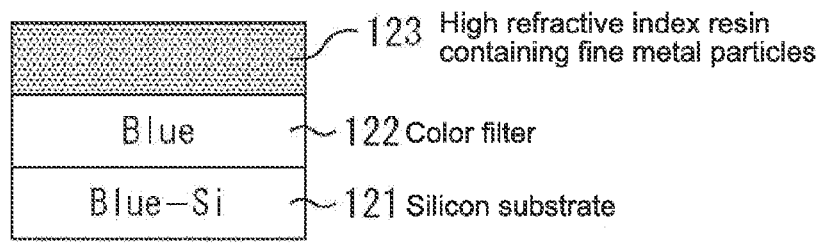
FIGS. 2A and 2B illustrate an example of how a spectrum varies.
Figure 2B:
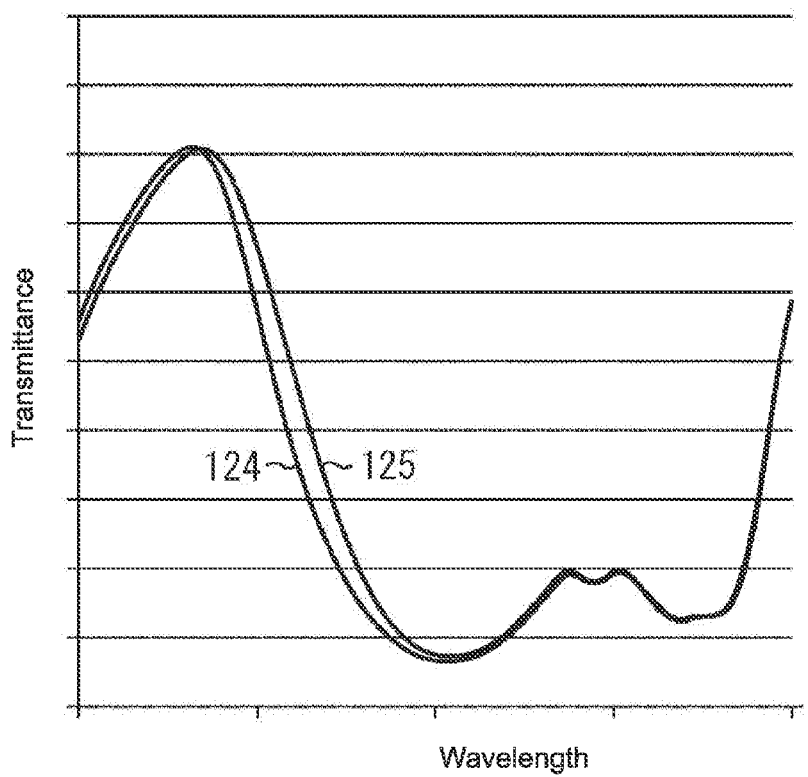

Next, more detailed description is made of the influence of the species of ions on the color filters 105. FIGS. 2A and 2B show an example of results of a simulation of the influence of the species of ions on the color filters 105 in a case where the protective film was not formed. In this simulation, an element configured as illustrated in FIG. 2A was used as a model of an image pickup element in which the protective film was not formed. As illustrated in FIG. 2A, this element was a laminate of a silicon substrate 121, a blue color filter 122, and a high refractive index resin 123 containing fine metal particles. The silicon substrate 121 was a model of the silicon substrate 101 (FIG. 1), and provided with a photodiode (not shown) as well as the silicon substrate 101. The color filter 122 was a model of the color filter 105A (FIG. 1). The high refractive index resin 123 containing fine metal particles was a model of the condenser lens 106A.

Results of measurement of spectral characteristics of the color filter 122 of the element are shown in the graph of FIG. 2B. In the graph of FIG. 2B, the abscissa axis represents a wavelength, and the ordinate axis represents a transmittance. Further, a curve 124 shows measurement results before heat treatment, and a curve 125 shows measurement results after heating at 230° C. for ten minutes was performed as heat treatment to be executed in a process step of manufacturing an image pickup element (heat treatment after formation of the microlens). As shown in the graph of FIG. 2B, a difference was observed between the spectral characteristics of the color filter 122 before the heating at 230° C. for ten minutes and the spectral characteristics thereof after the heating.

This spectral change was caused by movement of the ions of species (such as H and F) in the high refractive index resin 123 containing fine metal particles into the color filter 122 as a result of the heating. The spectral characteristics of the filter depend, for example, on its material. In other words, various materials are used for the filter in accordance with wavelength bands of light to be transmitted. In this case, when the material used therefor is liable to be influenced by the species of ions that move from the high refractive index resin 123 containing fine metal particles, the spectral change of the color filter 122 is liable to occur. Examples of such a material include a dioxane pigment (PV23). The dioxane pigment is used, for example, to obtain spectral characteristics of the blue color filter.

When the spectral change occurs in the color filter, a wavelength band of light to be photoelectrically converted by the photodiode is changed in accordance therewith. Thus, quality of captured images may be influenced thereby (specifically, quality of the images may be deteriorated).

Figure 3A:
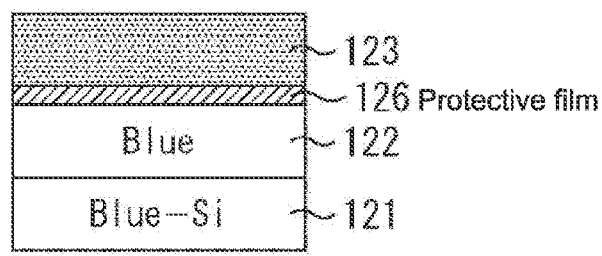
FIGS. 3A-3C illustrate other examples of how a spectrum varies.
Figure 3B:
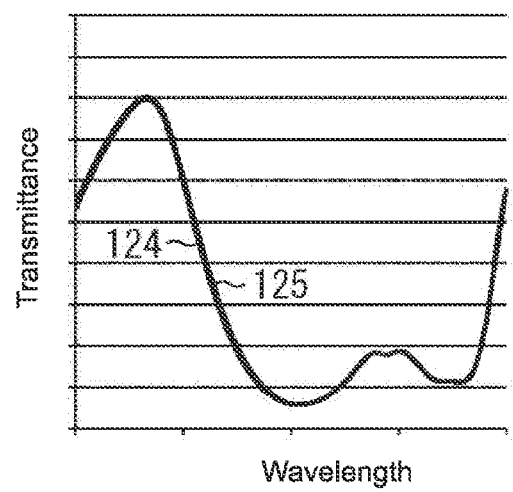
Figure 3C:
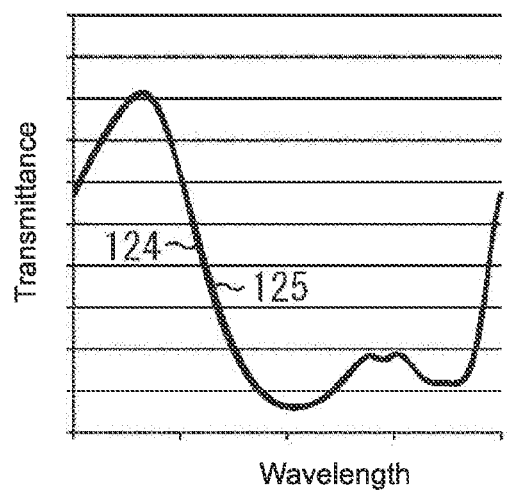

FIGS. 3A-3C show an example of results of simulations as in FIG. 2 in a case where the protective film is formed. In these simulations, an element configured as illustrated in FIG. 3A was used as a model of an image pickup element in which the protective film was formed. As illustrated in FIG. 3A, this element was obtained by additionally forming a protective film 126 between the blue color filter 122 and the high refractive index resin 123 containing fine metal particles in the laminate of FIG. 2A. The protective film 126 as a model of the protective film 110 (FIG. 1) was made of a silicon compound as well as the protective film 110, and had a film thickness of approximately several tens of nm (20 nm or more).

When the protective film 126 is made of silicon oxynitride (SiON), as shown in the graph of FIG. 3B, substantially no change was observed between the spectral characteristics of the color filter 122 before the heating at 230° C. for ten minutes (curve 124) and the spectral characteristics thereof after the heating (curve 125). Further, also when the protective film 126 was made of silicon nitride (SiN), as shown in the graph of FIG. 3C, substantially no change was observed between the spectral characteristics of the color filter 122 before the heating at 230° C. for ten minutes (curve 124) and the spectral characteristics thereof after the heating (curve 125).

As described above, when the protective film made of a silicon compound is formed between the high refractive index resin 123 containing fine metal particles and the color filter 122, the species of ions can be suppressed from moving from the high refractive index resin 123 containing fine metal particles into the color filter 122. With this, the spectral changes of the color filter 122 can be suppressed. As a result, quality of captured images can be suppressed from being deteriorated.

(Dark Current)

Figure 4A:
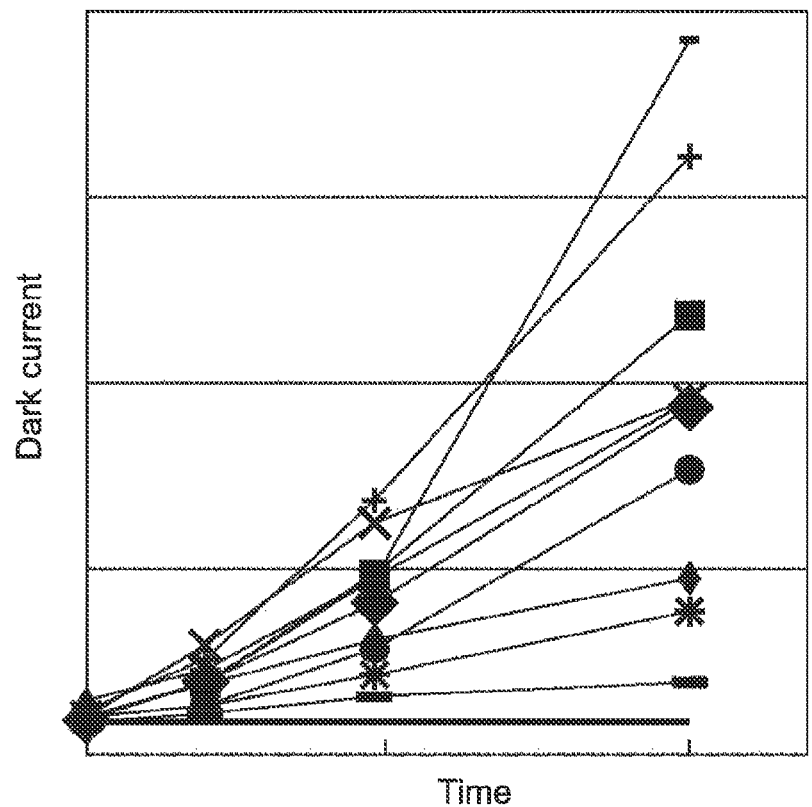
FIGS. 4A and 4B show examples of how dark current varies.
Figure 4B:
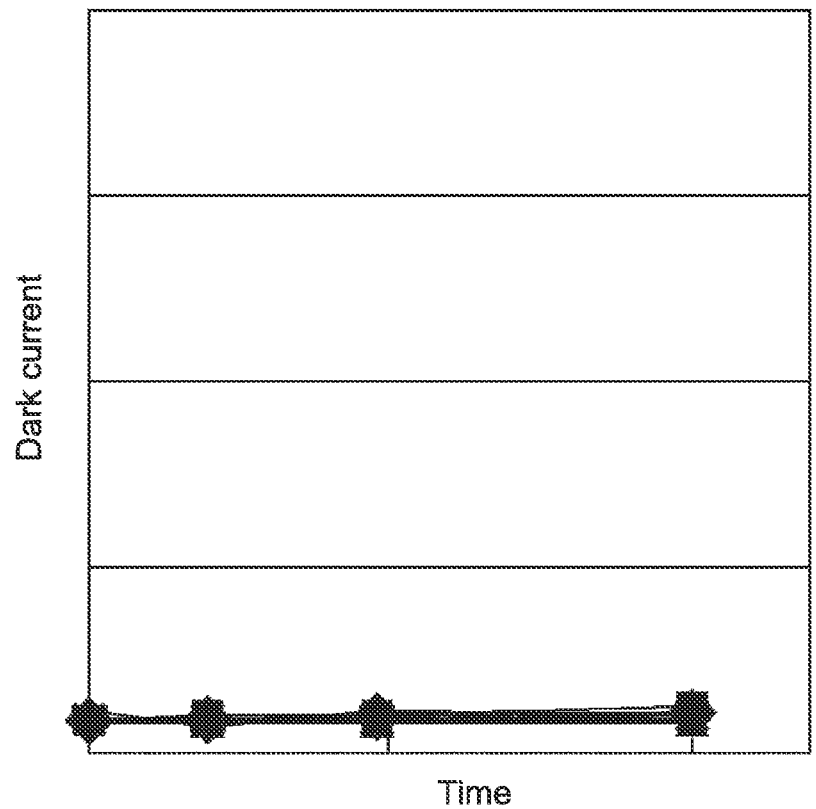

Next, more detailed description is made of the influence of the species of ions on the photodiodes 102. FIGS. 4A and 4B show results of examples of comparing how the influence of the species of ions on the photodiodes 102 changes depending on whether or not the protective film is formed. The graph of FIG. 4A shows an example of results of a simulation of generating the dark current in the element configured as illustrated in FIG. 2A (image pickup element in which the protective film 126 is not formed). In the graph of FIG. 4A, the abscissa axis represents time, and the ordinate axis represents a dark current amount.

In this case, as shown in the graph of FIG. 4A, as in the case of the simulations of the spectral change, substantially no dark current was generated under the state before the heat treatment at 230° C. for ten minutes. In contrast, the dark current was generated after the heat treatment. Measurements a plurality of times demonstrated that the dark current was generated while varying.

The graph of FIG. 4B shows an example of results of a simulation of generating the dark current in the element configured as illustrated in FIG. 3A (image pickup element in which the protective film 126 is formed). In the graph of FIG. 4B, the abscissa axis represents time, and the ordinate axis represents the dark current amount.

In this case, as shown in the graph of FIG. 4B, as in the case of the simulation of the spectral change, substantially no dark current was generated under either one of the states before and after the heat treatment at 230° C. for ten minutes.

As described above, when the protective film made of a silicon compound was formed between the high refractive index resin 123 containing fine metal particles and the photodiode (silicon substrate 121), the species of ions were successfully suppressed from moving from the high refractive index resin 123 containing fine metal particles into the silicon substrate 121. As a result, generation of the dark current and white spots was successfully suppressed.

From the results of the simulations described above, the same advantages can be obtained also in the image pickup element 100 of FIG. 1. First, the condenser lenses 106 are formed with use of the resin containing fine metal particles. With this, as described above, height reduction of the image pickup element 100 can be achieved, and the condenser lenses 106 can be formed with high accuracy while enhancing sensitivity and shading characteristics. Further, refractive indices of the condenser lenses 106 also can be increased.

In addition, as described above, when the protective film 110 made of a silicon compound is additionally formed between the condenser lenses 106 and the color filters 105 (and the photodiodes 102), the spectral changes of the color filters 105 can be suppressed, and generation of the dark current and white spots in the photodiodes 102 can be suppressed.

As a result, quality of images captured via the image pickup element 100 can be suppressed from being deteriorated.

(Protective Film)

As described above, the protective film made of a silicon compound may be formed as appropriate between a layer in which species of ions are generated (for example, layer of resin containing fine metal particles) and a layer into which the species of ions should not move (for example, layer of the color filters and layer of the silicon substrate in which photodiodes are formed). In other words, the protective film made of a silicon compound may be formed between any pair of the layer in which species of ions are generated and the layer into which the species of ions should not move.

Note that, as the protective film is formed between layers on the upper side (side closer to the layer in which species of ions are generated), the protective film is capable of suppressing the species of ions from moving into more of the layers. For example, as for the image pickup element 100 of FIG. 1, the protective film 110 is capable of suppressing the species of ions in the condenser lenses 106 from moving into both layers of the color filters 105 and the silicon substrate 101. Note that, as the protective film is formed between layers on a lower side (side farther from the layer in which the species of ions are generated), the protective film is capable of more reliably suppressing the species of ions from moving into the silicon substrate. Further, the protective film is capable of suppressing influence on layers that are not liable to be influenced by the species of ions.

Still further, the protective film may include a plurality of protective films (may be multi-layered). Note that, as the number of the protective films increases, a larger number of process steps need to be additionally executed, which may cause a cost increase. In addition, some or all of the protective films may be made of the same material, or may be made of materials different from each other.

Further, the film thickness of the protective film is not particularly limited. As the film thickness is larger, the species of ions can be more reliably suppressed from moving. In general, the species of ions can be sufficiently suppressed from moving with a thickness of approximately 20 nm or more.

(Other Examples of Position of Protective Film)

Although the protective film 110 is formed between the condenser lenses 106 and the color filters 105 in the description with reference to FIG. 1, the position of the protective film 110 is not limited thereto. For example, the protective film 110 may be formed at positions as illustrated in FIGS. 5 to 9 below.

Specifically, as illustrated in FIGS. 5A-5C, the protective film 110 may be bilayered. In the example of FIG. 5A, a protective film 110-1 as a first layer is formed at the same position as that of the protective film 110 of FIG. 1 (between the condenser lenses 106 and the color filters 105), and a protective film 110-2 as a second layer is formed between the color filters 105 and the planarizing film 104. The protective films 110-1 and 110-2 are each a thin film similar to the protective film 110 (FIG. 1), which is made, for example, of a silicon compound. The protective films 110-1 and 110-2 may be made of the same material, or may be made of materials different from each other. Further, the protective films 110-1 and 110-2 may have the same film thickness, or may have film thicknesses different from each other. In this case, the protective film 110-1 is capable of suppressing the species of ions in the condenser lenses 106 from moving into both the color filters 105 and the silicon substrate 101. Further, the protective film 110-2 is capable of suppressing the species of ions in the condenser lenses 106 from moving into the silicon substrate 101.

Further, in the example of FIG. 5B, the protective film 110-1 as the first layer is formed at the same position as that in the case of FIG. 5A, and the protective film 110-2 as the second layer is formed between the planarizing film 104 and a laminate of the light blocking films 103 and the silicon substrate 101. In this case, the protective film 110-2 is capable of suppressing the species of ions in the condenser lenses 106 from moving into the silicon substrate 101.

In addition, in this case, the protective film 110-2 is also capable of protecting the light blocking films 103. Thus, a chemical liquid to be used in process steps of forming upper layers with respect thereto can be selected from a wider range of options (an acidic chemical liquid, a basic chemical liquid, and the like).

Further, in the example of FIG. 5C, the protective film 110-1 as the first layer is formed at the same position as that in the case of FIG. 5A, and the protective film 110-2 as the second layer is formed between the silicon substrate 101 and a laminate of the planarizing film 104 and the light blocking films 103. Also in this case, the protective film 110-2 is capable of suppressing the species of ions in the condenser lenses 106 from moving into the silicon substrate 101.

Figure 6A:
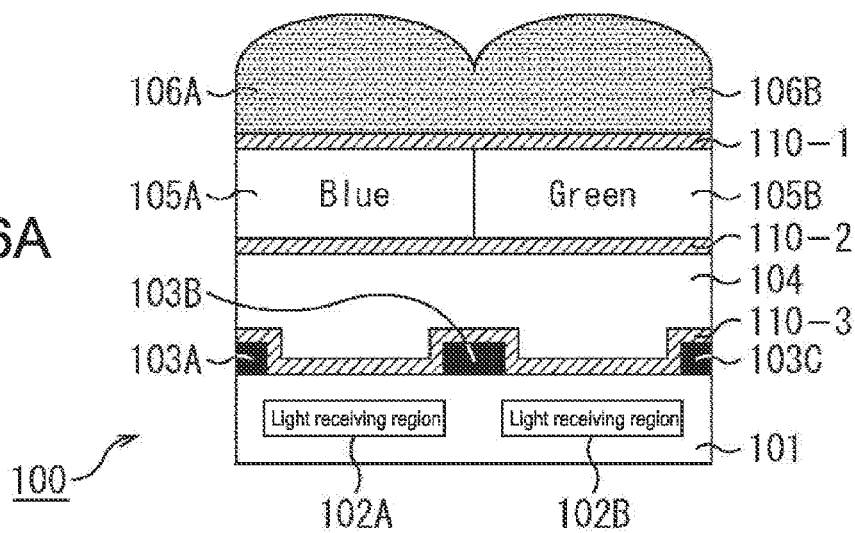
FIGS. 6A and 6B are sectional views illustrating other main configuration examples of the image pickup element.
Figure 6B:
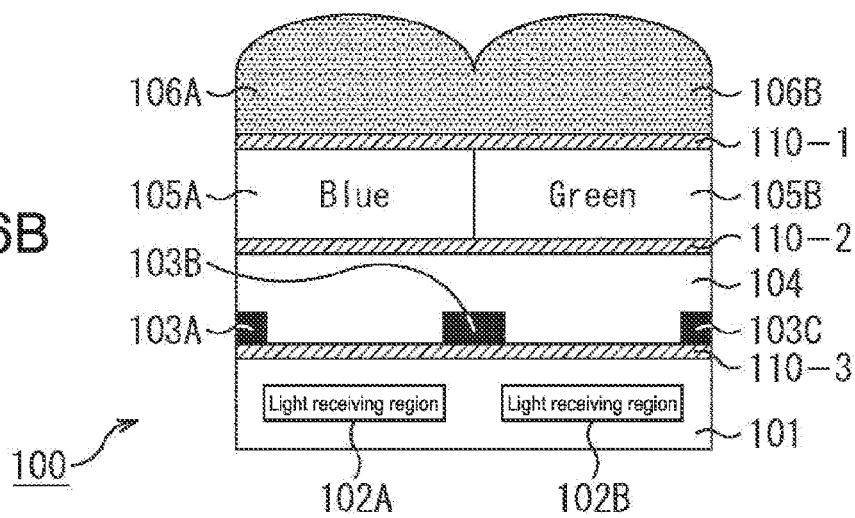

Alternatively, for example, as illustrated in FIGS. 6A and 6B, the protective film 110 may be tri-layered. In the example of FIG. 6A, the protective film 110-1 as the first layer is formed at the same position as that in the case of FIG. 5A, and the protective film 110-2 as the second layer is formed at the same position as that in the case of FIG. 5A. In addition, a protective film 110-3 as a third layer is formed at the same position as that of the protective film 110-2 of FIG. 5B (between the planarizing film 104 and the laminate of the light blocking films 103 and the silicon substrate 101).

The protective films 110-1 to 110-3 are each a thin film similar to the protective film 110 (FIG. 1), which is made, for example, of a silicon compound. The protective films 110-1 to 110-3 may be made of the same material, or may be made of materials different from each other. Further, the protective films 110-1 to 110-3 may have the same film thickness, or may have film thicknesses different from each other.

In this case, the protective film 110-3 is capable of suppressing the species of ions in the condenser lenses 106 from moving into the silicon substrate 101. The protective film 110-3 is also capable of protecting the light blocking films 103.

Further, in the example of FIG. 6B, the protective film 110-1 as the first layer and the protective film 110-2 as the second layer are formed at the same positions as those in the case of FIG. 6A, and the protective film 110-3 as the third layer is formed at the same position as that of the protective film 110-2 of FIG. 5C (between the silicon substrate 101 and the laminate of the planarizing film 104 and the light blocking films 103). Also in this case, the protective film 110-3 is capable of suppressing the species of ions in the condenser lenses 106 from moving into the silicon substrate 101.

Figure 7A:
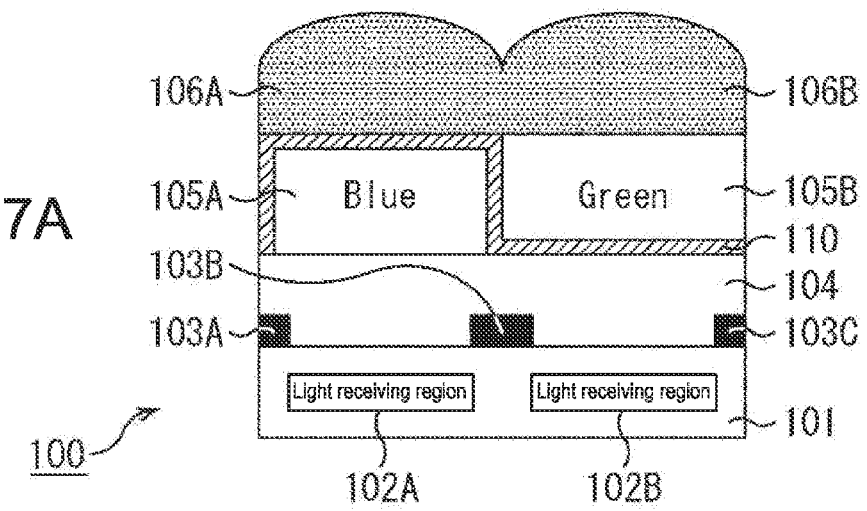
FIGS. 7A-7C are sectional views illustrating still other main configuration examples of the image pickup element.
Figure 7B:
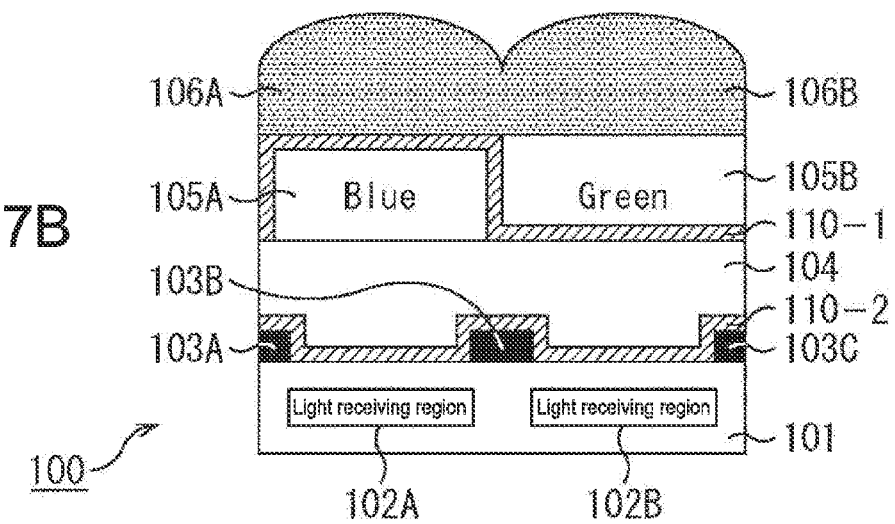
Figure 7C:
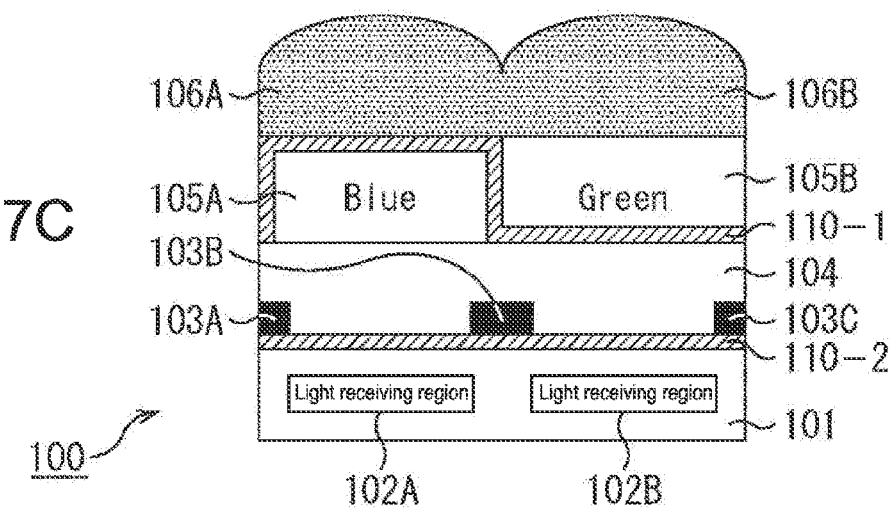

Still alternatively, for example, as illustrated in FIGS. 7A-7C, the protective film 110 may be configured to protect only a color filter of a predetermined color among the color filters 105 (specifically, only a filter configured to transmit light in a predetermined wavelength band among a plurality of color filters configured to transmit light in wavelength bands different from each other).

As described above, various materials are used for the filter in accordance with wavelength bands of light to be transmitted. For example, a material liable to be influenced by the species of ions that move from the high refractive index resin 123 containing fine metal particles, such as the dioxane pigment, may be used only for some of the filters. In such a case, as in the example of FIG. 7A, only the filter made of the material liable to be influenced by the species of ions may be protected with the protective film 110.

In the example of FIG. 7A, in a case where the blue color filter 105A is the filter made of the material liable to be influenced by the species of ions (for example, the dioxane pigment), the protective film 110 is formed to protect only the blue color filter 105A among the color filters 105. Specifically, the protective film 110 is formed to extend between the condenser lens 106A and the blue color filter 105A, between the blue color filter 105A and a color filter of a different color in an adjacent pixel (for example, the green color filter 105B), and between the color filter of the different color in the adjacent pixel (for example, the green color filter 105B) and the planarizing film 104.

In this case, the protective film 110 is capable of suppressing the species of ions in the condenser lenses 106 from moving into both the blue color filter 105A and the silicon substrate 101.

Also in this case, the protective film 110 can be multilayered. Further, in the example of FIG. 7B, the protective film 110-1 as the first layer is formed at the same position as that of the protective film 110 of FIG. 7A, and the protective film 110-2 as the second layer is formed at the same position as that of the protective film 110-2 of FIG. 5B (between the planarizing film 104 and the laminate of the light blocking films 103 and the silicon substrate 101). In this case, the protective film 110-2 is capable of suppressing the species of ions in the condenser lenses 106 from moving into the silicon substrate 101. Further, in this case, the protective film 110-2 is also capable of protecting the light blocking films 103.

Further, in the example of FIG. 7C, the protective film 110-1 as the first layer is formed at the same position as that of the protective film 110 of FIG. 7A, and the protective film 110-2 as the second layer is formed at the same position as that of the protective film 110-2 of FIG. 5C (between the silicon substrate 101 and the laminate of the planarizing film 104 and the light blocking films 103). In this case, the protective film 110-2 is capable of suppressing the species of ions in the condenser lenses 106 from moving into the silicon substrate 101.

Figure 8A:
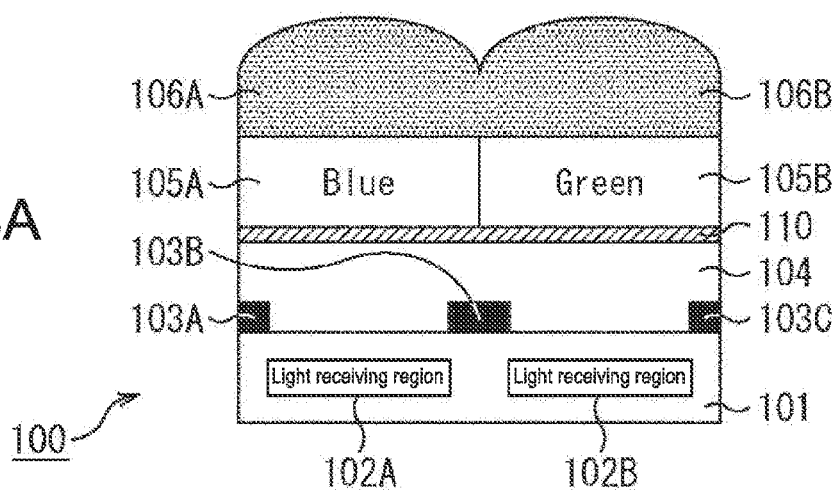
FIGS. 8A-8C are sectional views illustrating yet other main configuration examples of the image pickup element.
Figure 8B:
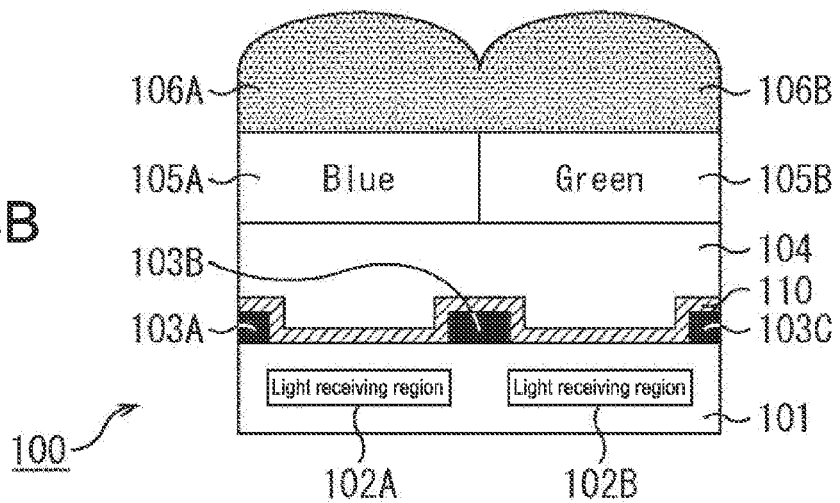
Figure 8C:
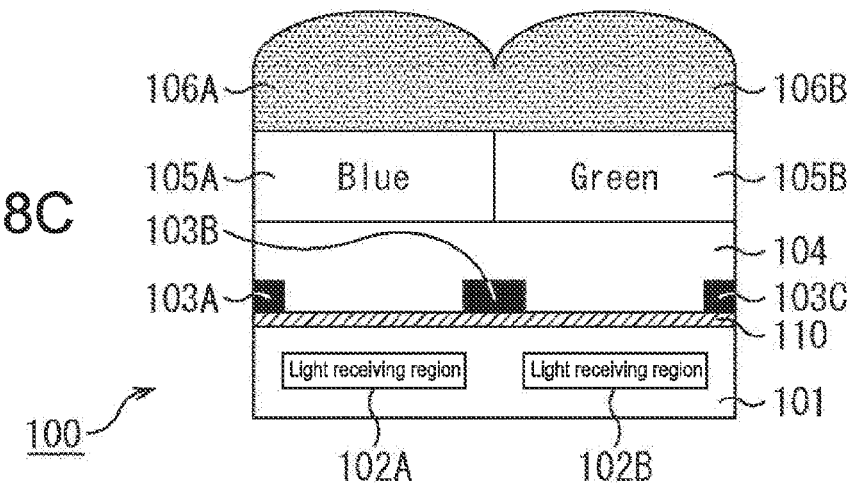

Yet alternatively, for example, in a case where the color filters 105 are not liable to be influenced by the species of ions (for example, in a case where the color filters 105 do not contain the dioxane pigment), as illustrated in FIGS. 8A-8C, the color filters 105 need not necessarily be protected with the protective film 110. In the example of FIG. 8A, the protective film 110, which is formed at the same position as that of the protective film 110-2 of FIG. 5A (between the color filters 105 and the planarizing film 104), is formed as a single layer. In this case, the protective film 110 is capable of suppressing the species of ions in the condenser lenses 106 from moving into the silicon substrate 101.

Further, in the example of FIG. 8B, the protective film 110, which is formed at the same position as that of the protective film 110-2 of FIG. 5B (between the planarizing film 104 and the laminate of the light blocking films 103 and the silicon substrate 101), is formed as a single layer. In this case, the protective film 110 is capable of suppressing the species of ions in the condenser lenses 106 from moving into the silicon substrate 101. In addition, the protective film 110 is also capable of protecting the light blocking films 103.

Still further, in the example of FIG. 8C, the protective film 110, which is formed at the same position as that of the protective film 110-2 of FIG. 5C (between the silicon substrate 101 and the laminate of the planarizing film 104 and the light blocking films 103), is formed as a single layer. In this case, the protective film 110 is capable of suppressing the species of ions in the condenser lenses 106 from moving into the silicon substrate 101.

Figure 9A:
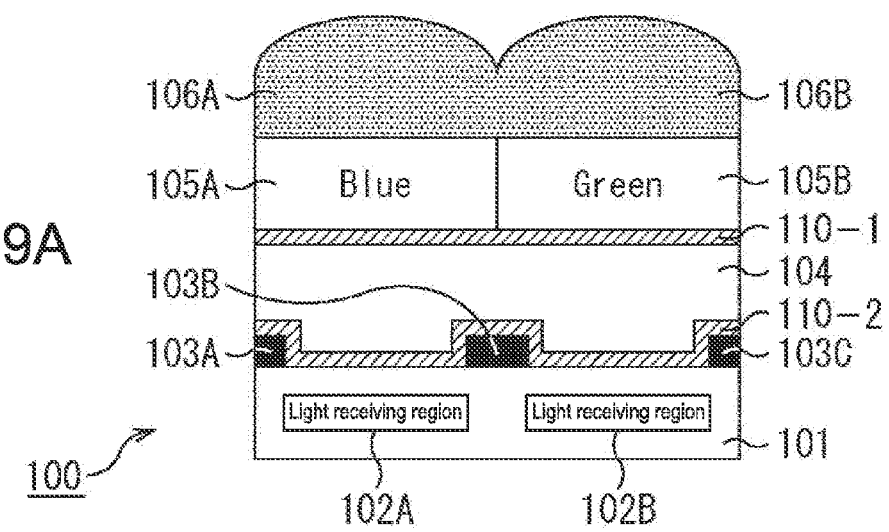
FIGS. 9A and 9B are sectional views illustrating yet other main configuration examples of the image pickup element.
Figure 9B:
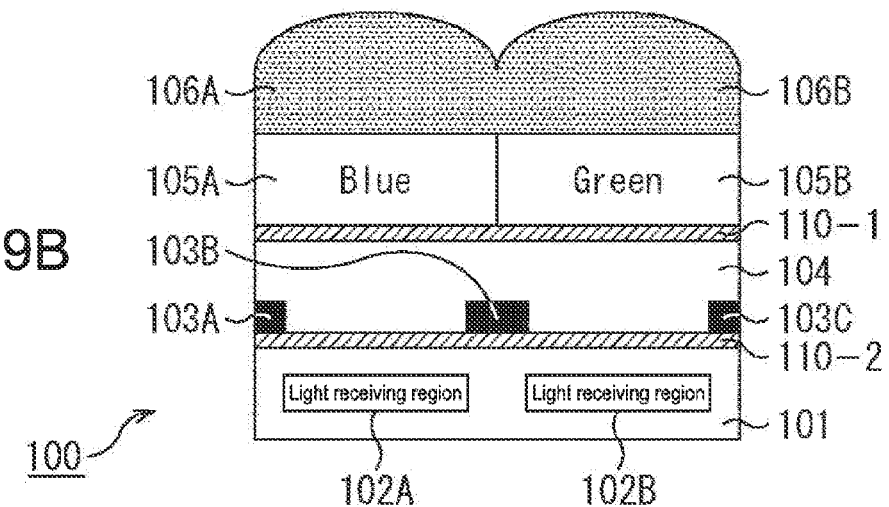

Also in this case, as illustrated in FIGS. 9A-9B, the protective film 110 can be multilayered. Further, in the example of FIG. 9A, the protective film 110-1 as the first layer is formed at the same position as that of the protective film 110 of FIG. 8A (between the color filters 105 and the planarizing film 104), and the protective film 110-2 as the second layer is formed at the same position as that of the protective film 110 of FIG. 8B (between the planarizing film 104 and the laminate of the light blocking films 103 and the silicon substrate 101). In this case, the protective films 110-1 and 110-2 are capable of suppressing the species of ions in the condenser lenses 106 from moving into the silicon substrate 101. Further, the protective film 110-2 is also capable of protecting the light blocking films 103.

Further, in the example of FIG. 9B, the protective film 110-1 as the first layer is formed at the same position as that in the case of FIG. 9A, and the protective film 110-2 as the second layer is formed at the same position as that of the protective film 110 of FIG. 8C (between the silicon substrate 101 and the laminate of the planarizing film 104 and the light blocking films 103). In this case, the protective films 110-1 and 110-2 are capable of suppressing the species of ions in the condenser lenses 106 from moving into the silicon substrate 101.

2. Second Embodiment

Manufacturing Apparatus

Figure 10:
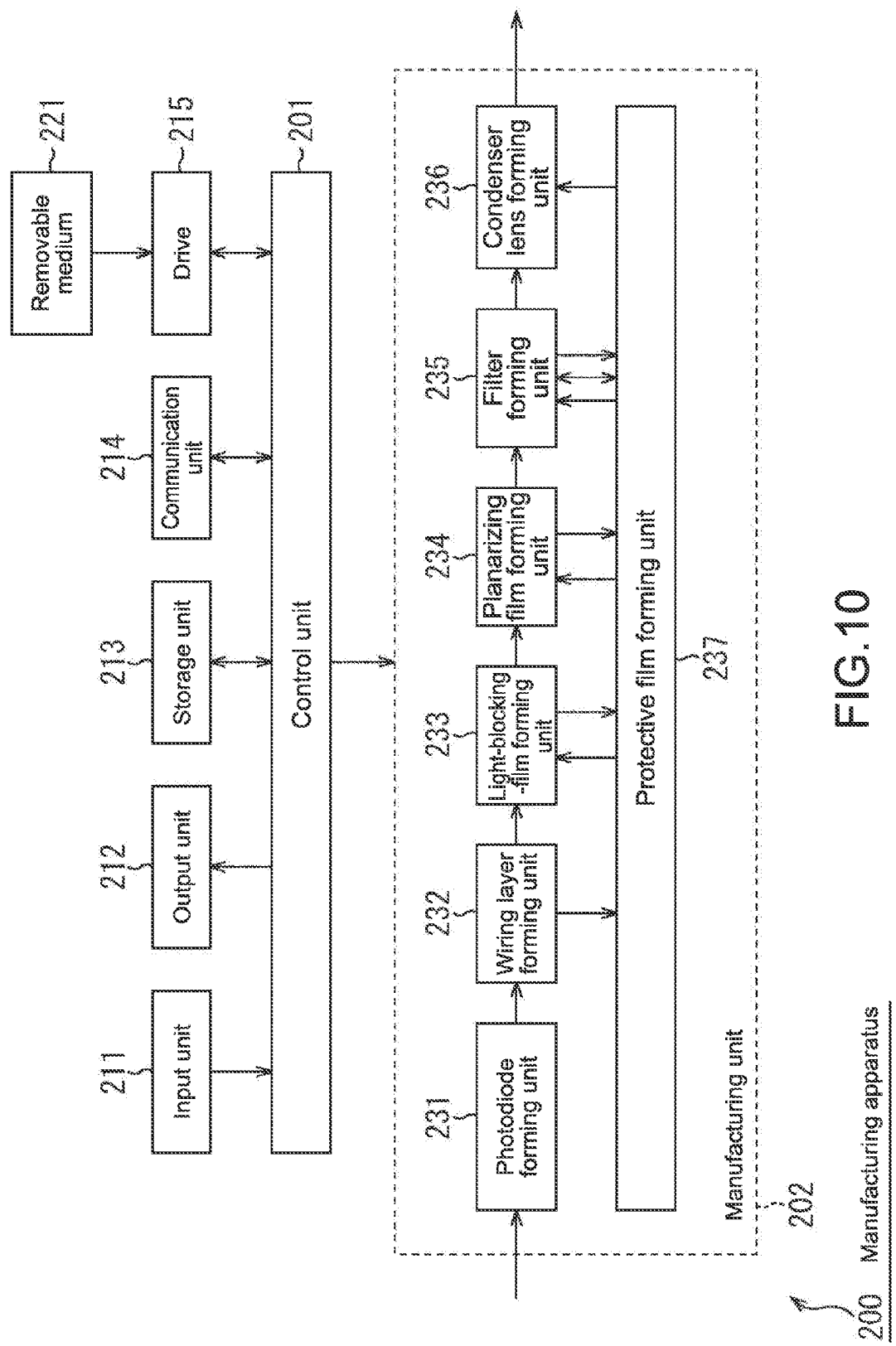
FIG. 10 is a block diagram showing a main configuration example of a manufacturing apparatus.

FIG. 10 is a block diagram showing a main configuration example of a manufacturing apparatus configured to manufacture the image pickup element 100 (image sensor) to which the present technology is applied. A manufacturing apparatus 200 shown in FIG. 10 includes a control unit 201 and a manufacturing unit 202.

The control unit 201 includes a CPU (Central Processing Unit), a ROM (Read Only Memory), and a RAM (Random Access Memory), and is configured to control units in the manufacturing unit 202 so as to execute processes of controlling manufacture of the image pickup element 100. For example, the CPU of the control unit 201 is configured to execute various processes in accordance with programs stored in the ROM. Further, the CPU is configured also to execute various processes in accordance with programs loaded from a storage unit 213 to the RAM. The RAM is configured to store, as appropriate, for example, data that is used by the CPU at the time of executing the various processes.

The manufacturing unit 202 is configured to be controlled by the control unit 201 so as to execute the processes in the manufacture of the image pickup element 100. The manufacturing unit 202 includes a photodiode forming unit 231, a wiring layer forming unit 232, a light-blocking-film forming unit 233, a planarizing film forming unit 234, a filter forming unit 235, a condenser lens forming unit 236, and a protective film forming unit 237.

The photodiode forming unit 231 is configured to form the photodiodes 102 in the silicon substrate 101. The wiring layer forming unit 232 is configured to form a wiring layer (not shown) on a surface on a side opposite to the light incident surface of the silicon substrate 101 (i.e., lower side in FIG. 1). The light-blocking-film forming unit 233 is configured to form the light blocking films 103. The planarizing film forming unit 234 is configured to form the planarizing film 104. The filter forming unit 235 is configured to form the color filters 105. The condenser lens forming unit 236 is configured to form the condenser lenses 106 made of the resin containing fine metal particles. The protective film forming unit 237 is configured to form the protective film 110.

The photodiode forming unit 231 to the protective film forming unit 237 are controlled by the control unit 201 so as to execute the process steps of manufacturing the image pickup element 100.

Further, the manufacturing apparatus 200 includes an input unit 211, an output unit 212, a storage unit 213, a communication unit 214, and a drive 215.

Examples of the input unit 211 include a keyboard, a mouse, a touch panel, an external input terminal. The input unit 211 is configured to accept input of user's instructions and information items from the outside, and supply the instructions and the information items to the control unit 201. Examples of the output unit 212 include displays such as a CRT (Cathode Ray Tube) display and an LCD (Liquid Crystal Display), a speaker, and an external output terminal. The output unit 212 is configured to output various information items supplied from the control unit 201 as images, voice, analog signals, or digital data.

The storage unit 213 includes a storage medium of any type such as a flash memory, an SSD (Solid State Drive), and a hard disk, and is configured to store the information items supplied from the control unit 201, and to read and supply the stored information items in response to a request from the control unit 201.

Examples of the communication unit 214 include an interface and a modem of a LAN (Local Area Network) or a wireless LAN. The communication unit 214 is configured to execute communication processes with external apparatus via networks including the Internet. Specifically, via the communication unit 214, the information items supplied from the control unit 201 are sent to a communication counterpart, and information items received from the communication counterpart are supplied to the control unit 201.

The drive 215 is configured to be connected as appropriate to the control unit 201. A removable medium 221 such as a magnetic disk, an optical disk, a magneto-optical disk, and a semiconductor memory is mounted as appropriate to the drive 215. Computer programs are loaded from the removable medium 221 through intermediation of the drive 215, and installed as appropriate to the storage unit 213.

(Flow 1 of Manufacturing Process)

Figure 11:
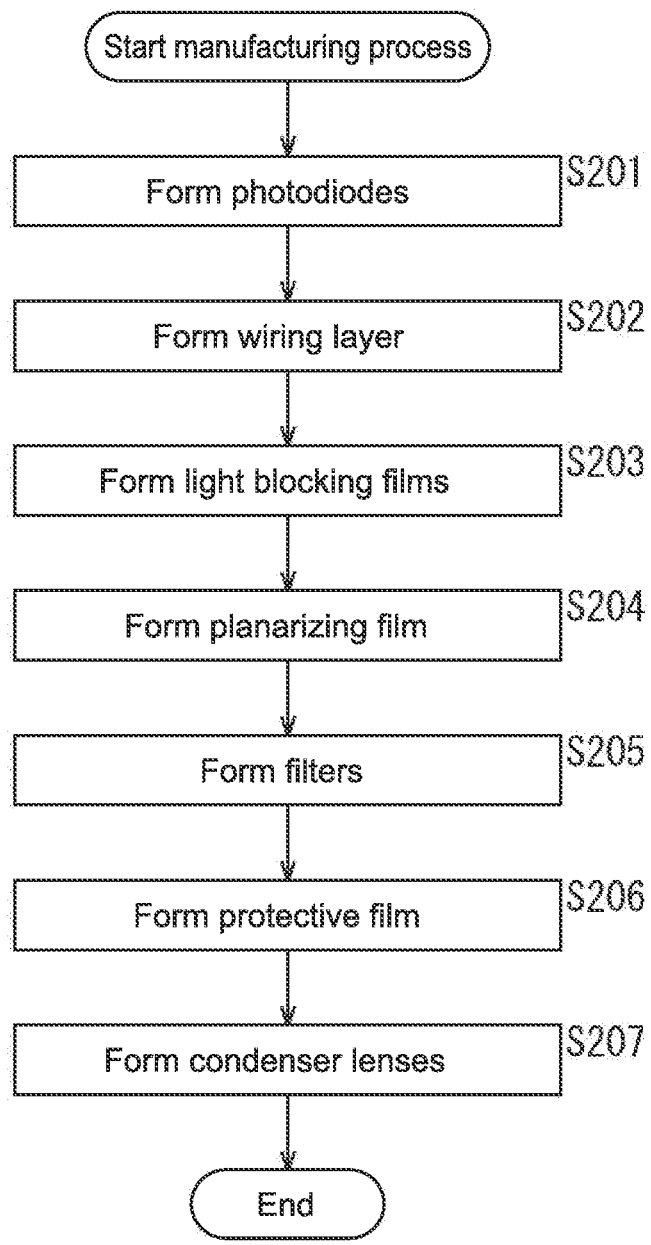
FIG. 11 is a flowchart showing an example of a flow of a manufacturing process.

With reference to the flowchart of FIG. 11, description is made of a flow of a manufacturing process for the image pickup element 100, which is executed by the manufacturing apparatus 200. Note that, the flow of the manufacturing process shown in the flowchart of FIG. 11 is applied to a case of manufacturing the image pickup element 100 in the example of FIG. 1.

Specifically, in this case, the protective film forming unit 237 acquires, from the filter forming unit 235, an element in which the color filters 105 are laminated on a laminate of the silicon substrate 101 in which the photodiodes 102 are formed and which is provided with the wiring layer thereunder, the light blocking films 103, and the planarizing film 104. Then, the protective film forming unit 237 forms and laminates the protective film 110 on the light incident surfaces (upper side in FIG. 1) of the color filters 105 of the element. Next, the protective film forming unit 237 supplies the element provided with the protective film 110 to the condenser lens forming unit 236.

After the manufacturing process is started, in Step S201, the control unit 201 controls the photodiode forming unit 231 so as to form the photodiodes 102 in the silicon substrate 101 correspondingly to respective pixels, the silicon substrate 101 being supplied from the outside.

In Step S202, the control unit 201 controls the wiring layer forming unit 232 so as to form and laminate the wiring layer (not shown) on the surface on the side opposite to the light incident surface of the silicon substrate 101 in which the photodiodes 102 are formed (lower side in FIG. 1), the wiring layer including multi-layer wiring made of metals such as copper and aluminum.

In Step S203, the control unit 201 controls the light-blocking-film forming unit 233 so as to form the light blocking films 103 along the pixel edge portions on the light incident surface (upper side in FIG. 1) of the silicon substrate 101.

In Step S204, the control unit 201 controls the planarizing film forming unit 234 so as to form and laminate the planarizing film 104 on the light incident surface (upper side in FIG. 1) of the silicon substrate 101 from above the light blocking films 103 in FIG. 1, the light blocking films 103 also being formed on the light incident surface.

In Step S205, the control unit 201 controls the filter forming unit 235 so as to form and laminate the color filters 105 on the light incident surface (upper side in FIG. 1) of the planarizing film 104.

In Step S206, the control unit 201 controls the protective film forming unit 237 so as to form and laminate the protective film 110 on the light incident surfaces (upper side in FIG. 1) of the color filters 105.

In Step S207, the control unit 201 controls the condenser lens forming unit 236 so as to form the condenser lenses 106 on a light incident surface (upper side in FIG. 1) of the protective film 110.

After the process of Step S207 is completed, the element provided with the condenser lenses 106 is supplied as the image pickup element 100 to the outside of the manufacturing apparatus 200. Then, the manufacturing process is completed.

By the manufacturing process executed as described above by the manufacturing apparatus 200, the image pickup element 100 (FIG. 1) to which the present technology is applied can be obtained. Specifically, when the image pickup element 100 is manufactured as described above, height reduction and enhancement of both sensitivity and shading characteristics can be achieved, and the microlenses (condenser lenses 106) each can be formed to have a high refractive index with high accuracy. In addition, generation of the spectral changes of the color filters 105, and generation of the dark current and white spots in the photodiodes 102 can be suppressed. With this, the image pickup element 100 is capable of suppressing deterioration in quality of captured images.

Note that, the protective film 110 can be formed at other positions (between other layers) merely by executing the process of Step S206 at timings different from that in the example of FIG. 11. Further, the protective film 110 can be multilayered merely by repeatedly executing the process of Step S206 at predetermined timings as many as the number of layers.

For example, in order to manufacture the image pickup element 100 of the configuration example of FIG. 5A, the protective film forming unit 237 acquires, from the planarizing film forming unit 234, an element in which the planarizing film 104 is laminated on a laminate of the silicon substrate 101 in which the photodiodes 102 are formed and which is provided with the wiring layer thereunder and the light blocking films 103. Then, the protective film forming unit 237 forms and laminates the protective film 110-2 on the light incident surface of the planarizing film 104 of the element. Next, the protective film forming unit 237 supplies the element provided with the protective film 110-2 to the filter forming unit 235. After that, the protective film forming unit 237 acquires, from the filter forming unit 235, the element in which the color filters 105 are laminated on the laminate of the silicon substrate 101 in which the photodiodes 102 are formed and which is provided with the wiring layer thereunder, the light blocking films 103, the planarizing film 104, and the protective film 110-2. Then, the protective film forming unit 237 forms and laminates the protective film 110-1 on the light incident surfaces of the color filters 105 of the element. Next, the protective film forming unit 237 supplies the element provided with the protective film 110-1 to the condenser lens forming unit 236.

In other words, with reference to the flowchart of FIG. 11, the protective film forming unit 237 executes the process of Step S206 not only between the process of Step S204 and the process of Step S205 so as to form the protective film 110-2 but also between the process of Step S205 and the process of Step S207 so as to form the protective film 110-1.

Further, for example, in order to manufacture the image pickup element 100 of the configuration example of FIG. 5B, the protective film forming unit 237 acquires, from the light-blocking-film forming unit 233, an element in which the light blocking films 103 are laminated on the silicon substrate 101 in which the photodiodes 102 are formed and which is provided with the wiring layer thereunder. Then, the protective film forming unit 237 forms and laminates the protective film 110-2 on the light incident surface of the silicon substrate 101 of the element, the light blocking films 103 also being formed on the light incident surface. Next, the protective film forming unit 237 supplies the element provided with the protective film 110-2 to the planarizing film forming unit 234. After that, the protective film forming unit 237 acquires, from the filter forming unit 235, the element in which the color filters 105 are laminated on the laminate of the silicon substrate 101 in which the photodiodes 102 are formed and which is provided with the wiring layer thereunder, the light blocking films 103, the protective film 110-2, and the planarizing film 104. Then, the protective film forming unit 237 forms and laminates the protective film 110-1 on the light incident surfaces of the color filters 105 of the element. Next, the protective film forming unit 237 supplies the element provided with the protective film 110-1 to the condenser lens forming unit 236.

In other words, with reference to the flowchart of FIG. 11, the protective film forming unit 237 executes the process of Step S206 not only between the process of Step S203 and the process of Step S204 so as to form the protective film 110-2 but also between the process of Step S205 and the process of Step S207 so as to form the protective film 110-1.

Still further, for example, in order to manufacture the image pickup element 100 of the configuration example of FIG. 5C, the protective film forming unit 237 acquires, from the wiring layer forming unit 232, an element in which the wiring layer is formed under the silicon substrate 101 in which the photodiodes 102 are formed. Then, the protective film forming unit 237 forms and laminates the protective film 110-2 on the light incident surface of the silicon substrate 101 of the element. Next, the protective film forming unit 237 supplies the element provided with the protective film 110-2 to the light-blocking-film forming unit 233. After that, the protective film forming unit 237 acquires, from the filter forming unit 235, the element in which the color filters 105 are laminated on the laminate of the silicon substrate 101 in which the photodiodes 102 are formed and which is provided with the wiring layer thereunder, the protective film 110-2, the light blocking films 103, and the planarizing film 104. Then, the protective film forming unit 237 forms and laminates the protective film 110-1 on the light incident surfaces of the color filters 105 of the element. Next, the protective film forming unit 237 supplies the element provided with the protective film 110-1 to the condenser lens forming unit 236.

In other words, with reference to the flowchart of FIG. 11, the protective film forming unit 237 executes the process of Step S206 not only between the process of Step S202 and the process of Step S203 so as to form the protective film 110-2 but also between the process of Step S205 and the process of Step S207 so as to form the protective film 110-1.

Yet further, for example, in order to manufacture the image pickup element 100 of the configuration example of FIG. 6A, the protective film forming unit 237 acquires, from the light-blocking-film forming unit 233, an element in which the light blocking films 103 are laminated on the silicon substrate 101 in which the photodiodes 102 are formed and which is provided with the wiring layer thereunder. Then, the protective film forming unit 237 forms and laminates the protective film 110-3 on the light incident surface of the silicon substrate 101 of the element, the light blocking films 103 also being formed on the light incident surface. Next, the protective film forming unit 237 supplies the element provided with the protective film 110-3 to the planarizing film forming unit 234. After that, the protective film forming unit 237 acquires, from the planarizing film forming unit 234, the element in which the planarizing film 104 is laminated on the laminate of the silicon substrate 101 in which the photodiodes 102 are formed and which is provided with the wiring layer thereunder, the light blocking films 103, and the protective film 110-3. Then, the protective film forming unit 237 forms and laminates the protective film 110-2 on the light incident surface of the planarizing film 104 of the element. Next, the protective film forming unit 237 supplies the element provided with the protective film 110-2 to the filter forming unit 235. After that, the protective film forming unit 237 acquires, from the filter forming unit 235, the element in which the color filters 105 are laminated on the laminate of the silicon substrate 101 in which the photodiodes 102 are formed and which is provided with the wiring layer thereunder, the light blocking films 103, the protective film 110-3, the planarizing film 104, and the protective film 110-2. Then, the protective film forming unit 237 forms and laminates the protective film 110-1 on the light incident surfaces of the color filters 105 of the element. Next, the protective film forming unit 237 supplies the element provided with the protective film 110-1 to the condenser lens forming unit 236.

In other words, with reference to the flowchart of FIG. 11, the protective film forming unit 237 executes the process of Step S206 not only between the process of Step S203 and the process of Step S204 so as to form the protective film 110-3 but also between the process of Step S204 and the process of Step S205 so as to form the protective film 110-2 and between the process of Step S205 and the process of Step S207 so as to form the protective film 110-1.

Yet further, for example, in order to manufacture the image pickup element 100 of the configuration example of FIG. 6B, the protective film forming unit 237 acquires, from the wiring layer forming unit 232, an element in which the wiring layer is formed under the silicon substrate 101 in which the photodiodes 102 are formed. Then, the protective film forming unit 237 forms and laminates the protective film 110-3 on the light incident surface of the silicon substrate 101 of the element. Next, the protective film forming unit 237 supplies the element provided with the protective film 110-3 to the light-blocking-film forming unit 233. After that, the protective film forming unit 237 acquires, from the planarizing film forming unit 234, the element in which the planarizing film 104 is laminated on the laminate of the silicon substrate 101 in which the photodiodes 102 are formed and which is provided with the wiring layer thereunder, the protective film 110-3, and the light blocking films 103. Then, the protective film forming unit 237 forms and laminates the protective film 110-2 on the light incident surface of the planarizing film 104 of the element. Next, the protective film forming unit 237 supplies the element provided with the protective film 110-2 to the filter forming unit 235. After that, the protective film forming unit 237 acquires, from the filter forming unit 235, the element in which the color filters 105 are laminated on the laminate of on the silicon substrate 101 in which the photodiodes 102 are formed and which is provided with the wiring layer thereunder, the protective film 110-3, the light blocking films 103, the planarizing film 104, and the protective film 110-2. Then, the protective film forming unit 237 forms and laminates the protective film 110-1 on the light incident surfaces of the color filters 105 of the element. Next, the protective film forming unit 237 supplies the element provided with the protective film 110-1 to the condenser lens forming unit 236.

In other words, with reference to the flowchart of FIG. 11, the protective film forming unit 237 executes the process of Step S206 not only between the process of Step S202 and the process of Step S203 so as to form the protective film 110-3 but also between the process of Step S204 and the process of Step S205 so as to form the protective film 110-2 and between the process of Step S205 and the process of Step S207 so as to form the protective film 110-1.

Yet further, for example, in order to manufacture the image pickup element 100 of the configuration example of FIG. 8A, the protective film forming unit 237 acquires, from the planarizing film forming unit 234, an element in which the planarizing film 104 is laminated on a laminate of the silicon substrate 101 in which the photodiodes 102 are formed and which is provided with the wiring layer thereunder and the light blocking films 103. Then, the protective film forming unit 237 forms and laminates the protective film 110 on the light incident surface of the planarizing film 104 of the element. Next, the protective film forming unit 237 supplies the element provided with the protective film 110 to the filter forming unit 235.

In other words, with reference to the flowchart of FIG. 11, the protective film forming unit 237 executes the process of Step S206 between the process of Step S204 and the process of Step S205 so as to form the protective film 110.

Yet further, for example, in order to manufacture the image pickup element 100 of the configuration example of FIG. 8B, the protective film forming unit 237 acquires, from the light-blocking-film forming unit 233, an element in which the light blocking films 103 are laminated on the silicon substrate 101 in which the photodiodes 102 are formed and which is provided with the wiring layer thereunder. Then, the protective film forming unit 237 forms and laminates the protective film 110 on the light incident surface of the silicon substrate 101 of the element, the light blocking films 103 also being formed on the light incident surface. Next, the protective film forming unit 237 supplies the element provided with the protective film 110 to the planarizing film forming unit 234.

In other words, with reference to the flowchart of FIG. 11, the protective film forming unit 237 executes the process of Step S206 between the process of Step S203 and the process of Step S204 so as to form the protective film 110.

Yet further, for example, in order to manufacture the image pickup element 100 of the configuration example of FIG. 8C, the protective film forming unit 237 acquires, from the wiring layer forming unit 232, an element in which the wiring layer is formed under the silicon substrate 101 in which the photodiodes 102 are formed. Then, the protective film forming unit 237 forms and laminates the protective film 110 on the light incident surface of the silicon substrate 101 of the element. Next, the protective film forming unit 237 supplies the element provided with the protective film 110 to the light-blocking-film forming unit 233.

In other words, with reference to the flowchart of FIG. 11, the protective film forming unit 237 executes the process of Step S206 between the process of Step S202 and the process of Step S203 so as to form the protective film 110.

Yet further, for example, in order to manufacture the image pickup element 100 of the configuration example of FIG. 9A, the protective film forming unit 237 acquires, from the light-blocking-film forming unit 233, an element in which the light blocking films 103 are laminated on the silicon substrate 101 in which the photodiodes 102 are formed and which is provided with the wiring layer thereunder. Then, the protective film forming unit 237 forms and laminates the protective film 110-2 on the light incident surface of the silicon substrate 101 of the element, the light blocking films 103 also being formed on the light incident surface. Next, the protective film forming unit 237 supplies the element provided with the protective film 110-2 to the planarizing film forming unit 234. After that, the protective film forming unit 237 acquires, from the planarizing film forming unit 234, the element in which the planarizing film 104 is laminated on the laminate of the silicon substrate 101 in which the photodiodes 102 are formed and which is provided with the wiring layer thereunder, the light blocking films 103, and the protective film 110-2. Then, the protective film forming unit 237 forms and laminates the protective film 110-1 on the light incident surface of the planarizing film 104 of the element. Next, the protective film forming unit 237 supplies the element provided with the protective film 110-1 to the filter forming unit 235.

In other words, with reference to the flowchart of FIG. 11, the protective film forming unit 237 executes the process of Step S206 not only between the process of Step S203 and the process of Step S204 so as to form the protective film 110-2 but also between the process of Step S204 and the process of Step S205 so as to form the protective film 110-1.

Yet further, for example, in order to manufacture the image pickup element 100 of the configuration example of FIG. 9B, the protective film forming unit 237 acquires, from the wiring layer forming unit 232, an element in which the wiring layer is formed under the silicon substrate 101 in which the photodiodes 102 are formed. Then, the protective film forming unit 237 forms and laminates the protective film 110-2 on the light incident surface of the silicon substrate 101 of the element. Next, the protective film forming unit 237 supplies the element provided with the protective film 110-2 to the light-blocking-film forming unit 233. After that, the protective film forming unit 237 acquires, from the planarizing film forming unit 234, the element in which the planarizing film 104 is laminated on the laminate of the silicon substrate 101 in which the photodiodes 102 are formed and which is provided with the wiring layer thereunder, the protective film 110-2, the light blocking films 103, and the planarizing film 104. Then, the protective film forming unit 237 forms and laminates the protective film 110-1 on the light incident surface of the planarizing film 104 of the element. Next, the protective film forming unit 237 supplies the element provided with the protective film 110-1 to the filter forming unit 235.

In other words, with reference to the flowchart of FIG. 11, the protective film forming unit 237 executes the process of Step S206 not only between the process of Step S202 and the process of Step S203 so as to form the protective film 110-2 but also between the process of Step S204 and the process of Step S205 so as to form the protective film 110-1.

(Flow 2 of Manufacturing Process)

Figure 12:
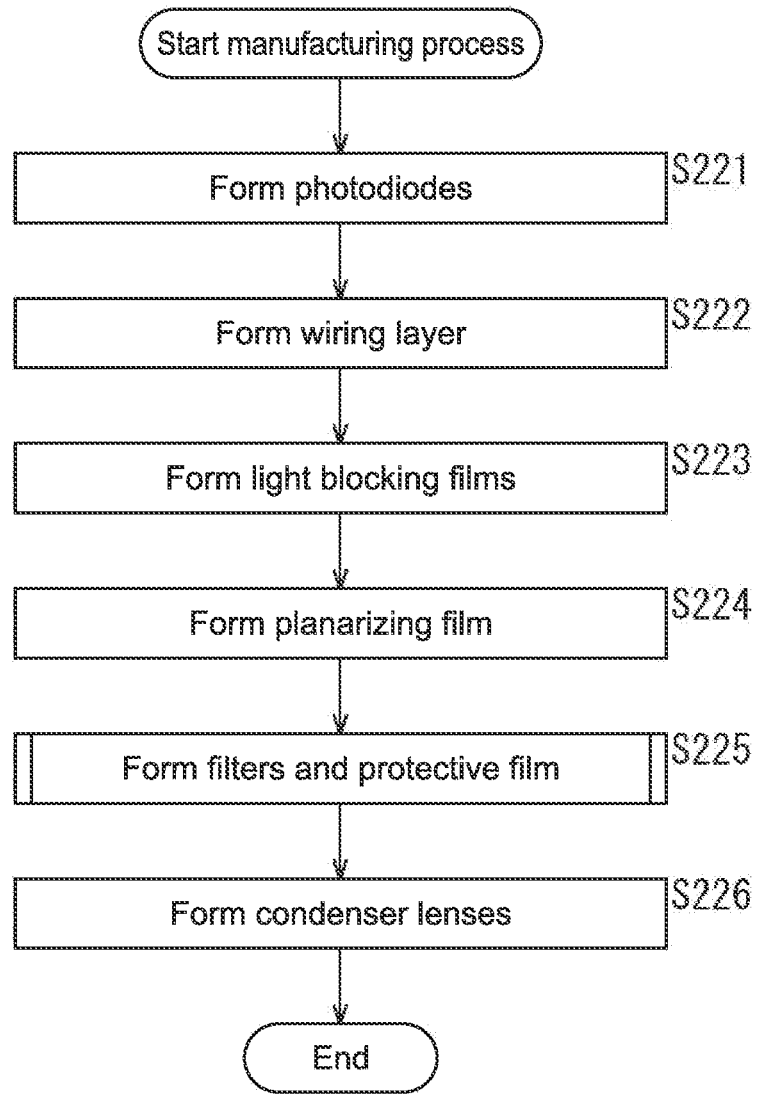
FIG. 12 is a flowchart showing another example of the flow of the manufacturing process.

Note that, the image pickup elements 100 in the examples of FIG. 7 can be manufactured merely by executing the process of Step S205 and the process of Step S206 of FIG. 11 parallel to each other. With reference to the flowchart of FIG. 12, description is made of an example of the flow of the manufacturing process in that case. The flowchart of FIG. 12 shows an example of the flow of the manufacturing process for the image pickup elements 100 in the examples of FIG. 7.

Specifically, in this case, the protective film forming unit 237 acquires, from the filter forming unit 235, an element in which one of the color filters 105 is formed at a predetermined part (pixel) on the light incident surface (upper side in FIG. 7A) of the planarizing film 104 (for example, color filter 105A is formed in the left pixel of FIG. 7A). Then, the protective film forming unit 237 forms and laminates the protective film 110 from the light incident surface side (upper side in FIG. 7A) of the color filter 105A and the planarizing film 104 of the element. Next, the protective film forming unit 237 supplies the element provided with the protective film 110 to the filter forming unit 235. The filter forming unit 235 forms and laminates the rest of the color filters 105 (for example, color filter 105B) on predetermined parts (pixels) on the light incident surface of the protective film 110.

After the manufacturing process is started, the processes of Steps S221 to S224 are executed similar to the processes of Steps S201 to S204 in FIG. 11. With this, the photodiodes 102 are formed in the silicon substrate 101, and the wiring layer, the light blocking films 103, and the planarizing film 104 are formed.

In Step S225, the control unit 201 controls the filter forming unit 235 and the protective film forming unit 237 so as to execute a filter-and-protective-film forming process. With this, the color filters 105 and the protective film 110 are formed and laminated on the light incident surface (upper side in FIG. 7A) of the planarizing film 104.

After the color filters 105 and the protective film 110 are formed as illustrated in FIG. 7A, in Step S226, the control unit 201 controls the condenser lens forming unit 236 so as to form the condenser lenses 106 on the light incident surfaces (upper side in FIG. 7A) of the color filters 105 and the protective film 110.

After the process of Step S226 is completed, the element provided with the condenser lenses 106 is supplied as the image pickup element 100 to the outside of the manufacturing apparatus 200. Then, the manufacturing process is completed.

(Flow of Filter-and-Protective-Film Forming Process)

Figure 13:
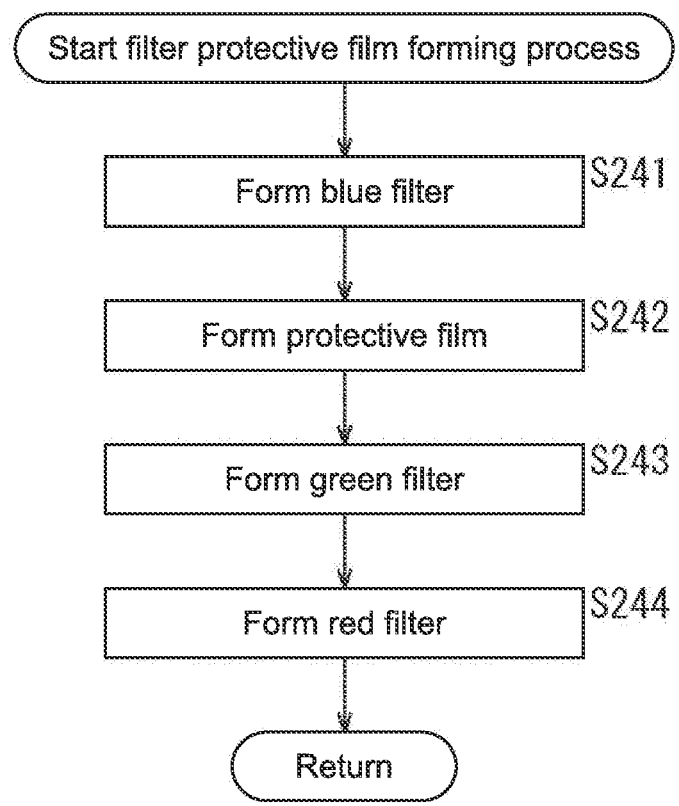
FIG. 13 is a flowchart showing an example of a flow of a filter-and-protective-film forming process.

Next, with reference to the flowchart of FIG. 13, description is made of an example of a flow of the filter-and-protective-film forming process to be executed in Step S225 in FIG. 12. Note that, the flow of the flowchart of FIG. 13 shows a process in a case of forming color filters of three colors of red (R), green (G), and blue (B) as the color filters 105.

After the filter-and-protective-film forming process is started, in Step S241, the filter forming unit 235 forms and laminates a blue filter (in the example of FIG. 7A, color filter 105A) on a predetermined part (pixel) on the light incident surface (upper side in FIG. 7A) of the planarizing film 104.

In Step S242, the protective film forming unit 237 forms and laminates the protective film 110 on the light incident surface (upper side in FIG. 7A) of the planarizing film 104, on a part of which the blue filter (color filter 105A) is formed in Step S241 (in other words, laminates the protective film 110 on both the planarizing film 104 and the color filter 105A).

In Step S243, the filter forming unit 235 forms and laminates a green filter (in the example of FIG. 7A, color filter 105B) on a predetermined part (pixel) on the light incident surface (upper side in FIG. 7A) of the protective film 110 formed in Step S242.

In Step S244, the filter forming unit 235 forms and laminates a red filter on another predetermined part (pixel) on the light incident surface (upper side in FIG. 7A) of the protective film 110 formed in Step S242.

After the color filters 105 of the three colors and the protective film 110 are formed, the filter-and-protective-film forming process is completed. Then, the flow proceeds to Step S226.

By the processes executed as described above by the manufacturing apparatus 200, the image pickup element 100 (FIG. 7A) to which the present technology is applied can be obtained. Specifically, when the image pickup element 100 is manufactured as described above, height reduction and enhancement of both sensitivity and shading characteristics can be achieved, and the microlenses (condenser lenses 106) each can be formed to have a high refractive index with high accuracy. In addition, generation of the spectral changes of the color filters 105 each configured to define a predetermined band, and generation of the dark current and white spots in the photodiodes 102 can be suppressed. With this, the image pickup element 100 is capable of suppressing deterioration in quality of captured images.

Note that, in the flowchart of FIG. 13, either the process of Step S243 or the process of Step S244 may be executed first. In other words, the processes may be executed in any order as long as the process of forming the filter to be protected by the protective film 110 on a side opposite to the condenser lens 106 side of the protective film 110 is executed prior to Step S242, and the processes of forming the filters not to be protected by the protective film 110 are executed subsequently to Step S242.

Thus, for example, in order to protect the green filter (color filter 105B), the process of Step S243 is executed prior to the process of Step S242, and the process of Step S241 and the process of Step S244 are executed subsequently to the process of Step S242. Further, for example, in order to protect the red filter, the process of Step S244 is executed prior to the process of Step S242, and the process of Step S241 and the process of Step S243 are executed subsequently to the process of Step S242. The same applies to a case where the colors of the color filters 105 are used in other combinations, and also to a case where the filter forming unit 235 forms filters other than the color filters 105.

In addition, as in the examples of FIGS. 7B and 7C, in order to form additional protective films at positions other than that of the protective film 110 of FIG. 7A, in addition to the processes of Steps of FIG. 12, the process of Step S206 of FIG. 11 is executed at a predetermined timing.

Specifically, in order to manufacture the image pickup element 100 of the configuration example of FIG. 7B, the protective film forming unit 237 acquires, from the light-blocking-film forming unit 233, an element in which the light blocking films 103 are laminated on the silicon substrate 101 in which the photodiodes 102 are formed and which is provided with the wiring layer thereunder. Then, the protective film forming unit 237 forms and laminates the protective film 110-2 on the light incident surface of the silicon substrate 101 of the element, the light blocking films 103 also being formed on the light incident surface. Next, the protective film forming unit 237 supplies the element provided with the protective film 110-2 to the planarizing film forming unit 234. After that, the protective film forming unit 237 acquires, from the filter forming unit 235, the element in which one of the color filters 105 is formed at a predetermined part (pixel) on the light incident surface of the planarizing film 104 (for example, color filter 105A is formed). Then, the protective film forming unit 237 forms and laminates the protective film 110-1 on the element, specifically, on the light incident surfaces (upper side in FIG. 7B) of the color filters 105 (color filter 105A) and the planarizing film 104. Next, the protective film forming unit 237 supplies the element provided with the protective film 110-1 to the filter forming unit 235. The filter forming unit 235 forms and laminates the rest of the color filters 105 (for example, color filter 105B) on predetermined parts (pixels) on the light incident surface of the protective film 110.

In other words, with reference to the flowchart of FIG. 12, the protective film forming unit 237 executes the process of Step S206 of FIG. 11 between the process of Step S223 and the process of Step S224 so as to form the protective film 110-2, and executes the filter-and-protective-film forming process of Step S225 so as to form the protective film 110-1.

Further, specifically, in order to manufacture the image pickup element 100 of the configuration example of FIG. 7C, the protective film forming unit 237 acquires, from the wiring layer forming unit 232, an element in which the wiring layer is formed under the silicon substrate 101 in which the photodiodes 102 are formed. Then, the protective film forming unit 237 forms and laminates the protective film 110-2 on the light incident surface of the silicon substrate 101 of the element. Next, the protective film forming unit 237 supplies the element provided with the protective film 110-2 to the light-blocking-film forming unit 233. After that, the protective film forming unit 237 acquires, from the filter forming unit 235, the element in which one of the color filters 105 is formed at a predetermined part (pixel) on the light incident surface of the planarizing film 104 (for example, color filter 105A is formed). Then, the protective film forming unit 237 forms and laminates the protective film 110-1 on the element, specifically, on the light incident surfaces (upper side in FIG. 7C) of the color filters 105 (color filter 105A) and the planarizing film 104. Next, the protective film forming unit 237 supplies the element provided with the protective film 110-1 to the filter forming unit 235. The filter forming unit 235 forms and laminates the rest of the color filters 105 (for example, color filter 105B) on predetermined parts (pixels) on the light incident surface of the protective film 110.

In other words, with reference to the flowchart of FIG. 12, the protective film forming unit 237 executes the process of Step S206 of FIG. 11 between the process of Step S222 and the process of Step S223 so as to form the protective film 110-2, and executes the filter-and-protective-film forming process of Step S225 so as to form the protective film 110-1.

3. Third Embodiment

Imaging Apparatus

The image pickup element 100 (image sensor) manufactured as described above with the present technology is applicable to devices such as an imaging apparatus. In other words, the present technology can be carried out not only as an image pickup element but also as a device using the image pickup element (for example, imaging apparatus).

Figure 14:
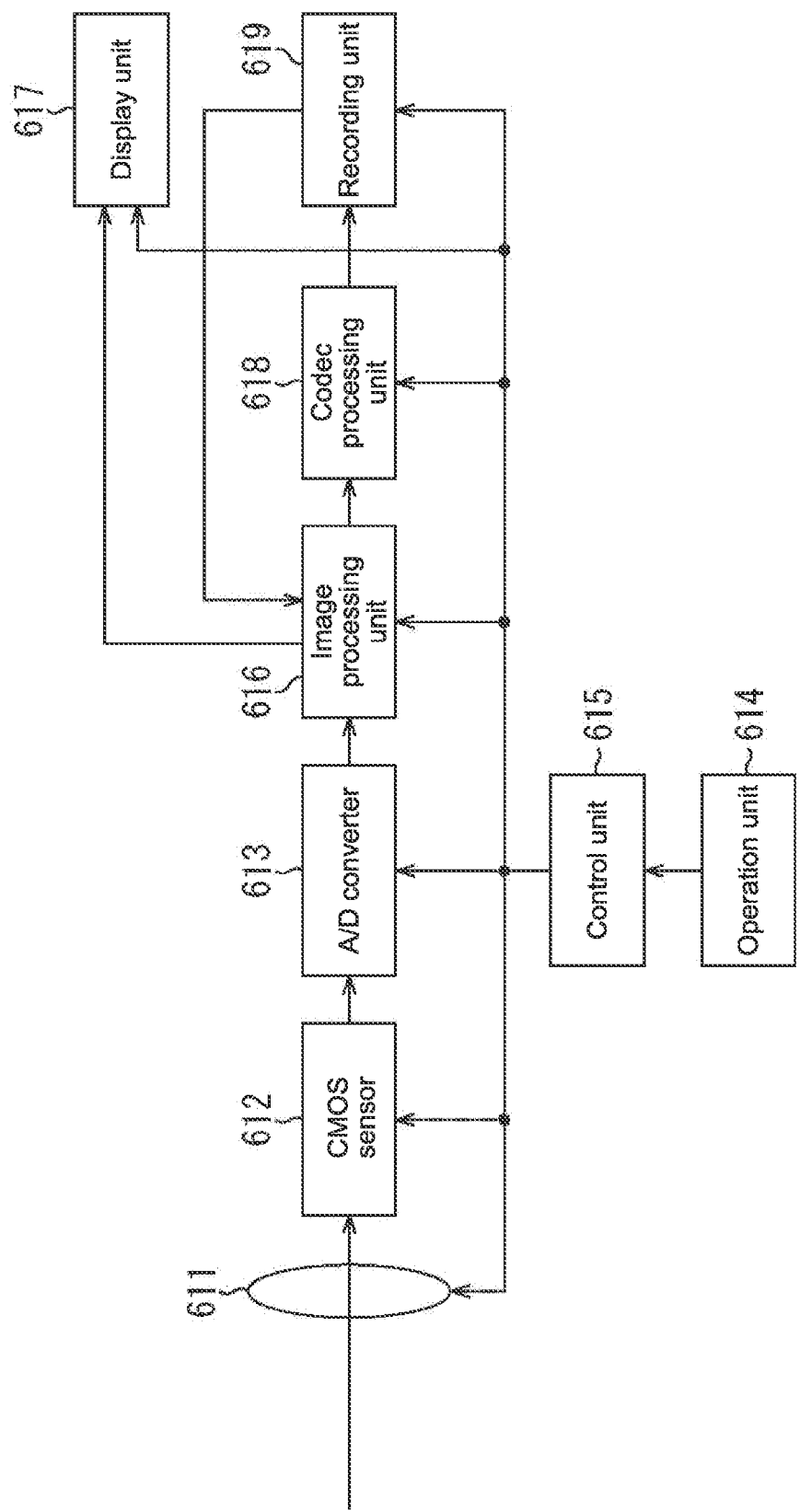
FIG. 14 is a block diagram showing a main configuration example of an imaging apparatus.

FIG. 14 is a block diagram showing a main configuration example of the imaging apparatus. An imaging apparatus 600 shown in FIG. 14 is an apparatus configured to image a photographic subject and output images of the photographic subject as electrical signals.

As shown in FIG. 14, the imaging apparatus 600 include an optical unit 611, a CMOS sensor 612, an A/D converter 613, an operation unit 614, a control unit 615, an image processing unit 616, a display unit 617, a codec processing unit 618, and a recording unit 619.

The optical unit 611 includes a lens configured to adjust a focal point with respect to a photographic subject and condense light beams from a focal position, an aperture configured to adjust exposure, and a shutter configured to control a image capturing timing. The optical unit 611 is configured to transmit light (incident light) therethrough from the photographic subject to the CMOS sensor 612.

The CMOS sensor 612 is configured to photoelectrically convert the incident light to a signal of each of the pixels (pixel signal), and transmit the signal to the A/D converter 613.

The A/D converter 613 is configured to convert the pixel signals supplied at predetermined timings from the CMOS sensor 612 to digital data items (image data items), and sequentially supply the data items to the image processing unit 616 at predetermined timings.

Examples of the operation unit 614 include a jog dial (trademark), keys, buttons, and a touch panel. The operation unit 614 is configured to accept input by a user, and transmit signals corresponding to the operation input to the control unit 615.

The control unit 615 is configured to drive and control, in response to the signals corresponding to the operation input via the operation unit 614 by the user, the optical unit 611, the CMOS sensor 612, the A/D converter 613, the image processing unit 616, the display unit 617, the codec processing unit 618, and the recording unit 619 so as to cause those units to execute imaging processes.

The image processing unit 616 is configured to execute various image processes such as color mixture correction, black level correction, white balance adjustment, a demosaic process, a matrix process, gamma correction, YC conversion on the image data items supplied from the A/D converter 613. The image processing unit 616 is configured also to supply the image data items subjected to the image processes to the display unit 617 and the codec processing unit 618.

Examples of the display unit 617 include a liquid crystal display. The display unit 617 is configured to display images of the photographic subject based on the image data items supplied from the image processing unit 616.

The codec processing unit 618 is configured to execute an encoding process according to a predetermined method on the image data items supplied from the image processing unit 616, and supply the encoded data items thus obtained to the recording unit 619.

The recording unit 619 is configured to record the encoded data items from the codec processing unit 618. The encoded data items recorded in the recording unit 619 is read and decoded as appropriate by the image processing unit 616. Image data items obtained by the decoding process are supplied to the display unit 617, and images corresponding thereto are displayed.

The present technology described above is applied to the CMOS sensor 612 of the imaging apparatus 600 as described above. In other words, the image pickup element 100 to which the present technology is applied is used as the CMOS sensor 612. Specifically, the CMOS sensor 612 includes the condenser lenses each made of the resin containing fine metal particles, and the protective film made of a silicon compound and formed between the condenser lenses and the filters or the photodiodes. Thus, height reduction and enhancement of both sensitivity and shading characteristics can be achieved, and the microlenses (condenser lenses 106) each can be formed to have a high refractive index with high accuracy. In addition, generation of the spectral changes of the color filters 105, and generation of the dark current and white spots in the photodiodes 102 can be suppressed. With this, the CMOS sensor 612 is capable of suppressing deterioration in quality of captured images. As a result, images of the photographic subject are captured in higher quality with the imaging apparatus 600.

Note that, the imaging apparatus to which the present technology is applied is not limited to the configuration described above, and other configurations may be employed. For example, the imaging apparatus is applicable not only to digital still cameras and digital camcorders, but also to information processing apparatus having an imaging function, such as a mobile phone, a smartphone, a tablet device, and a personal computer. Further, the imaging apparatus is applicable to a camera module to be used by being mounted to other information processing apparatus (or to be incorporated therein as a built-in device).

Note that, the "system" in this specification refers to an entire apparatus including a plurality of devices (apparatus).

Further, a configuration described as a single apparatus (or processing unit) hereinabove may be divided into a plurality of apparatus (or processing units). In contrast, configurations described as a plurality of apparatus (or processing units) hereinabove may be integrated into a single apparatus (or processing unit). Still further, as a matter of course, configurations other than those described hereinabove may be added to the configurations of the apparatus (or processing units). Yet further, as long as the configurations and operations of the entire system are substantially unchanged, a part of a configuration of a certain apparatus (or processing unit) may be incorporated in a configuration of another apparatus (or another processing unit). In other words, the embodiments of the present technology are not limited to the embodiments described hereinabove, and various modifications may be made thereto without departing from the gist of the present technology.

The present technology may include the following configurations.

(1) An image pickup element, including:
condenser lenses made of a resin containing fine metal particles;
photoelectric conversion elements formed in a silicon substrate and each configured to photoelectrically convert incident light that enter from an outside through corresponding one of the condenser lenses; and
a protective film made of a silicon compound, the protective film being formed between the condenser lenses and the silicon substrate.

(2) The image pickup element according to any one of Item (1) and Items (3) to (27), in which the protective film has a non-flat surface at least on the condenser lens side.

(3) The image pickup element according to any one of Items (1) and (2) and Items (4) to (27), in which the silicon compound includes any one of silicon dioxide ($SiO_2$), silicon oxynitride (SiON), and silicon nitride (SiN).

(4) The image pickup element according to any one of Items (1) to (3) and Items (5) to (27), in which the protective film has a film thickness of 20 nm or more.

(5) The image pickup element according to any one of Items (1) to (4) and Items (6) to (27), further including optical filters each formed between corresponding one of the condenser lenses and the silicon substrate and each configured to limit a wavelength band of the incident light to be transmitted therethrough, in which
the protective film is formed between the condenser lenses and the optical filters.

(6) The image pickup element according to any one of Items (1) to (5) and Items (7) to (27), in which the optical filters at least include a color filter containing a dioxane pigment.

(7) The image pickup element according to any one of Items (1) to (6) and Items (8) to (27), in which the color filter containing the dioxane pigment includes a blue color filter.

(8) The image pickup element according to any one of Items (1) to (7) and Items (9) to (27), further including a planarizing film formed between the optical filters and the silicon substrate, in which
the protective film includes another protective film formed between the optical filters and the planarizing film.

(9) The image pickup element according to any one of Items (1) to (8) and Items (10) to (27), in which the protective film includes still another protective film formed between the planarizing film and the silicon substrate.

(10) The image pickup element according to any one of Items (1) to (9) and Items (11) to (27), further including light blocking films formed along pixel edge portions between the planarizing film and the silicon substrate and configured to suppress the incident light from entering adjacent pixels, in which
the still another protective film formed between the planarizing film and the silicon substrate is formed between the planarizing film and a laminate of the light blocking films and the silicon substrate.

(11) The image pickup element according to any one of Items (1) to (10) and Items (12) to (27), further including a planarizing film formed between the optical filters and the silicon substrate, in which the protective film includes another protective film formed between the planarizing film and the silicon substrate.

(12) The image pickup element according to any one of Items (1) to (11) and Items (13) to (27), further including light blocking films formed along pixel edge portions between the planarizing film and the silicon substrate and configured to suppress the incident light from entering adjacent pixels, in which the other protective film formed between the planarizing film and the silicon substrate is formed between the planarizing film and a laminate of the light blocking films and the silicon substrate.

(13) The image pickup element according to any one of Items (1) to (12) and Items (14) to (27), further including:

optical filters each formed between corresponding one of the condenser lenses and the silicon substrate and each configured to limit a wavelength band of the incident light to be transmitted therethrough; and a planarizing film formed between the condenser lenses and the silicon substrate, in which the protective film is formed to extend between one of the optical filters and corresponding one of the condenser lenses, between the one of the optical filters and another of the optical filters, and between the other of the optical filters and the planarizing film.

(14) The image pickup element according to any one of Items (1) to (13) and Items (15) to (27), in which the one of the optical filters at least includes a color filter containing a dioxane pigment.

(15) The image pickup element according to any one of Items (1) to (14) and Items (16) to (27), in which the color filter containing the dioxane pigment includes a blue color filter.

(16) The image pickup element according to any one of Items (1) to (15) and Items (17) to (27), in which the protective film includes another protective film formed between the planarizing film and the silicon substrate.

(17) The image pickup element according to any one of Items (1) to (16) and Items (18) to (27), further including light blocking films formed along pixel edge portions between the planarizing film and the silicon substrate and configured to suppress the incident light from entering adjacent pixels, in which the other protective film formed between the planarizing film and the silicon substrate is formed between the planarizing film and a laminate of the light blocking films and the silicon substrate.

(18) The image pickup element according to any one of Items (1) to (17) and Items (19) to (27), further including:

optical filters each formed between corresponding one of the condenser lenses and the silicon substrate and each configured to limit a wavelength band of the incident light to be transmitted therethrough; and a planarizing film formed between the condenser lenses and the silicon substrate, in which the protective film is formed between the optical filters and the planarizing film.

(19) The image pickup element according to any one of Items (1) to (18) and Items (20) to (27), in which the protective film includes another protective film formed between the planarizing film and the silicon substrate.

(20) The image pickup element according to any one of Items (1) to (19) and Items (21) to (27), further including light blocking films formed along pixel edge portions between the planarizing film and the silicon substrate and configured to suppress the incident light from entering adjacent pixels, in which the other protective film formed between the planarizing film and the silicon substrate is formed between the planarizing film and a laminate of the light blocking films and the silicon substrate.

(21) The image pickup element according to any one of Items (1) to (20) and Items (22) to (27), further including:

optical filters each formed between corresponding one of the condenser lenses and the silicon substrate and each configured to limit a wavelength band of the incident light to be transmitted therethrough; and a planarizing film formed between the condenser lenses and the silicon substrate, in which the protective film is formed between the planarizing film and the silicon substrate.

(22) The image pickup element according to any one of Items (1) to (21) and Items (23) to (27), further including light blocking films formed along pixel edge portions between the planarizing film and the silicon substrate and configured to suppress the incident light from entering adjacent pixels, in which the protective film formed between the planarizing film and the silicon substrate is formed between the planarizing film and a laminate of the light blocking films and the silicon substrate.

(23) The image pickup element according to any one of Items (1) to (22) and Items (24) to (27), in which the resin containing fine metal particles is obtained by adding particles of a metal compound to a copolymer resin and dispersing the added particles of the metal compound in the copolymer resin.

(24) The image pickup element according to any one of Items (1) to (23) and Items (25) to (27), in which the copolymer resin includes any one of an acrylic resin, a styrene resin, and a silane resin.

(25) The image pickup element according to any one of Items (1) to (24) and Items (26) and (27), in which the metal compound includes any one of titanium (Ti), magnesium (Mg), aluminum (Al), and zinc (Zn).

(26) The image pickup element according to any one of Items (1) to (25), and Item (27), in which the resin containing fine metal particles has a refractive index within a range of from 1.6 to 2.0 at a wavelength of 500 nm.

(27) The image pickup element according to any one of Items (1) to (26), in which the resin containing fine metal particles has a transmittance of 90% or more in a wavelength band of from 400 nm to 700 nm.

(28) An imaging apparatus, including:

an image pickup element including condenser lenses made of a resin containing fine metal particles, photoelectric conversion elements formed in a silicon substrate and each configured to photoelectrically convert incident light that enter from an outside through corresponding one of the condenser lenses, and a protective film made of a silicon compound, the protective film being formed between the condenser lenses and the silicon substrate; and an image processing unit configured to execute image processes on data items of images captured via the image pickup element.

(29) A manufacturing apparatus configured to manufacture an image pickup element, the manufacturing apparatus including:

a photoelectric-conversion-element forming unit configured to form, in a silicon substrate, photoelectric conversion elements configured to photoelectrically convert incident light;

a protective film forming unit configured to form a protective film made of a silicon compound on an incident side of the silicon substrate in which the photoelectric conversion elements are formed by the photoelectric-conversion-element forming unit, the incident light entering the incident side of the silicon substrate; and a condenser lens forming unit configured to form condenser lenses each made of a resin containing fine metal particles on a side opposite to the silicon substrate side of the protective film formed by the protective film forming unit, the condenser lens being configured to condense the incident light.

(30) A manufacturing method for a manufacturing apparatus configured to manufacture an image pickup element, the manufacturing method including:

forming, in a silicon substrate, photoelectric conversion elements configured to photoelectrically convert incident light;

forming a protective film made of a silicon compound on an incident side of the silicon substrate in which the photoelectric conversion elements are formed, the incident light entering the incident side of the silicon substrate; and forming condenser lenses each made of a resin containing fine metal particles on a side opposite to the silicon substrate side of the protective film, the condenser lens being configured to condense the incident light.

It should be understood by those skilled in the art that various modifications, combinations, sub-combinations and alterations may occur depending on design requirements and other factors insofar as they are within the scope of the appended claims or the equivalents thereof.

What is claimed is:

1. An image pickup element, comprising:
condenser lenses made of a resin containing fine metal particles;
photoelectric conversion elements formed in a silicon substrate and each configured to photoelectrically convert incident light that enters from an outside through a corresponding one of the condenser lenses;
a protective film made of a silicon compound, the protective film being formed between the condenser lenses and the silicon substrate; and
optical filters each formed between a corresponding one of the condenser lenses and the silicon substrate and each configured to limit a wavelength band of the incident light to be transmitted therethrough, wherein
the protective film is formed between the condenser lenses and the optical filters.

2. The image pickup element according to claim 1, wherein the protective film has a non-flat surface at least on the condenser lens side.

3. The image pickup element according to claim 1, wherein the silicon compound includes any one of silicon dioxide (SiO2), silicon oxynitride (SiON), and silicon nitride (SiN).

4. The image pickup element according to claim 3, wherein the protective film has a film thickness of 20 nm or more.

5. The image pickup element according to claim 1, wherein the optical filters at least include a color filter containing a dioxane pigment.

6. The image pickup element according to claim 5, wherein the color filter containing the dioxane pigment includes a blue color filter.

7. The image pickup element according to claim 1, further comprising a planarizing film formed between the optical filters and the silicon substrate, wherein the protective film includes another protective film formed between the optical filters and the planarizing film.

8. The image pickup element according to claim 7, wherein the protective film includes still another protective film formed between the planarizing film and the silicon substrate.

9. The image pickup element according to claim 8, further comprising light blocking films formed along pixel edge portions between the planarizing film and the silicon substrate and configured to suppress the incident light from entering adjacent pixels, wherein
the still another protective film formed between the planarizing film and the silicon substrate is formed between the planarizing film and a laminate of the light blocking films and the silicon substrate.

10. The image pickup element according to claim 1, further comprising a planarizing film formed between the optical filters and the silicon substrate, wherein the protective film includes another protective film formed between the planarizing film and the silicon substrate.

11. The image pickup element according to claim 10, further comprising light blocking films formed along pixel edge portions between the planarizing film and the silicon substrate and configured to suppress the incident light from entering adjacent pixels, wherein
the other protective film formed between the planarizing film and the silicon substrate is formed between the planarizing film and a laminate of the light blocking films and the silicon substrate.

12. An image pickup element, comprising:
condenser lenses made of a resin containing fine metal particles;
photoelectric conversion elements formed in a silicon substrate and each configured to photoelectrically convert incident light that enters from an outside through a corresponding one of the condenser lenses;
a protective film made of a silicon compound, the protective film being formed between the condenser lenses and the silicon substrate;
optical filters each formed between a corresponding one of the condenser lenses and the silicon substrate and each configured to limit a wavelength band of the incident light to be transmitted therethrough; and
a planarizing film formed between the condenser lenses and the silicon substrate, wherein
the protective film is formed to extend between one of the optical filters and corresponding one of the condenser lenses, between the one of the optical filters and another of the optical filters, and between the other of the optical filters and the planarizing film.

13. The image pickup element according to claim 12, wherein the protective film includes another protective film formed between the planarizing film and the silicon substrate.

14. An imaging apparatus, comprising:
an image pickup element including
condenser lenses made of a resin containing fine metal particles,
photoelectric conversion elements formed in a silicon substrate and each configured to photoelectrically convert incident light that enters from an outside through a corresponding one of the condenser lenses,
a protective film made of a silicon compound, the protective film being formed between the condenser lenses and the silicon substrate, and
optical filters each formed between a corresponding one of the condenser lenses and the silicon substrate and each configured to limit a wavelength band of the incident light to be transmitted therethrough, wherein
the protective film is formed between the condenser lenses and the optical filters; and an image processing unit configured to execute image processes on data items of images captured via the image pickup element.

15. A manufacturing apparatus configured to manufacture an image pickup element, the manufacturing apparatus comprising:
- a photoelectric-conversion-element forming unit configured to form, in a silicon substrate, photoelectric conversion elements configured to photoelectrically convert incident light;
- a protective film forming unit configured to form a protective film made of a silicon compound on an incident side of the silicon substrate in which the photoelectric conversion elements are formed by the photoelectric-conversion-element forming unit, the incident light entering the incident side of the silicon substrate;
- a condenser lens forming unit configured to form condenser lenses each made of a resin containing fine metal particles on a side opposite to the silicon substrate side of the protective film formed by the protective film forming unit, the condenser lens being configured to condense the incident light; and
- an optical filter forming unit configured to form optical filters, wherein the optical filters are each formed between a corresponding one of the condenser lenses and the silicon substrate and are each configured to limit a wavelength band of the incident light to be transmitted therethrough, wherein the protective film is formed between the condenser lenses and the optical filter.

16. A manufacturing method for a manufacturing apparatus configured to manufacture an image pickup element, the manufacturing method comprising:
- forming, in a silicon substrate, photoelectric conversion elements configured to photoelectrically convert incident light;
- forming a protective film made of a silicon compound on an incident side of the silicon substrate in which the photoelectric conversion elements are formed, the incident light entering the incident side of the silicon substrate;
- forming condenser lenses each made of a resin containing fine metal particles on a side opposite to the silicon substrate side of the protective film, the condenser lens being configured to condense the incident light; and
- forming optical filters each formed between a corresponding one of the condenser lenses and the silicon substrate and each configured to limit a wavelength band of the incident light to be transmitted therethrough, wherein
the protective film is formed between the condenser lenses and the optical filters.

* * * * *